United States Patent
Fukunabe et al.

(10) Patent No.: US 7,000,312 B2
(45) Date of Patent: Feb. 21, 2006

(54) CIRCUIT BOARD DEVICE AND MOUNTING METHOD THEREFOR

(75) Inventors: Kenji Fukunabe, Sagamihara (JP); Masanobu Okada, Sagamihara (JP); Kazuyoshi Nakaya, Yokohama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 136 days.

(21) Appl. No.: 10/308,120

(22) Filed: Dec. 3, 2002

(65) Prior Publication Data

US 2003/0117784 A1    Jun. 26, 2003

(30) Foreign Application Priority Data

| Dec. 5, 2001 | (JP) | ............................. 2001-371657 |
| Jul. 18, 2002 | (JP) | ............................. 2002-210026 |
| Nov. 13, 2002 | (JP) | ............................. 2002-329830 |

(51) Int. Cl.
 *H01R 9/00* (2006.01)
 *H05K 3/00* (2006.01)

(52) U.S. Cl. ........................... 29/843; 29/830; 29/840; 174/260

(58) Field of Classification Search ............... 174/260; 257/692–699; 29/830, 840, 839, 843, 860, 29/842

See application file for complete search history.

(56) References Cited

U.S. PATENT DOCUMENTS

| 4,985,601 A | * | 1/1991 | Hagner ......................... 174/261 |
| 5,426,266 A | * | 6/1995 | Brown et al. ................ 174/267 |
| 5,962,917 A | * | 10/1999 | Moriyama ................... 257/697 |
| 6,115,262 A | * | 9/2000 | Brunner et al. ............. 361/774 |
| 6,566,611 B1 | * | 5/2003 | Kochanowski et al. ..... 174/261 |

FOREIGN PATENT DOCUMENTS

| EP | 0 996 322 | 10/1999 |
| JP | 01-268087 | 10/1989 |
| JP | 08-186360 | 7/1996 |
| JP | 08-288658 | 11/1996 |
| JP | 09-199819 | 7/1997 |
| JP | 11-017056 | 1/1999 |
| JP | 11-330661 | 11/1999 |
| JP | 2000-124588 | 4/2000 |
| JP | 2001-127188 | 5/2001 |
| JP | 2001-185641 | 7/2001 |

* cited by examiner

*Primary Examiner*—Kamand Cuneo
*Assistant Examiner*—Jeremy Norris
(74) *Attorney, Agent, or Firm*—Keating & Bennett, LLP

(57) ABSTRACT

In a circuit board, when lands provided on a rear surface of a substrate are each separated into a mainland and a subland, warping or other defects of the substrate can be ignored when soldering, and the substrate can be mounted with a high bonding strength. On the rear surface of a module substrate, partitions are each provided to separate a metal film into the mainland and the sub-land. Accordingly, when the substrate is mounted on a motherboard, solder applied beforehand from each end-surface electrode to the mainland can be largely protruded downward from the mainland, and warping or other defects of the substrate can be ignored by this protruding portion of the solder. In addition, in the state in which the substrate is mounted, since the solder is pushed out from between the mainland and the motherboard and overflows the partition, both the mainland and the sub-land can be soldered to the motherboard side, and hence stable bonding can be obtained at a large bonding area.

1 Claim, 30 Drawing Sheets

CIRCUIT BOARD DEVICE AND MOUNTING METHOD THEREFOR

BACKGROUND OF THE INVENTION

1. Field of the Invention

The present invention relates to circuit board devices which are preferably mounted on motherboards together with electronic components or other elements subassembled beforehand on the circuit board devices and also relates to a mounting method therefor.

2. Description of the Related Art

In general, as circuit board devices, for example, the structure in which a plurality of electronic components is subassembled beforehand on a module substrate has been well known (for example, disclosed in Japanese Unexamined Patent Application Publication No. 2001-127188).

The circuit board devices described above according to a conventional technique each includes a substrate having a front surface on which electronic components are mounted and a rear surface which are to be mounted on a motherboard, a plurality of end-surface electrodes provided on end surfaces of the substrate at predetermined intervals and connected to the electronic components, and a plurality of lands which are provided at the rear surface and connected to the plurality of end-surface electrodes and which are to be soldered to related electrodes of the motherboard together therewith.

In the circuit board device described above, the end-surface electrodes are each formed, for example, of a strip-shaped metal film extending in the thickness direction of the substrate, and one end of the end-surface electrode is connected to the electronic component through a wire pattern or other connection provided at the front surface. In addition, the other end of the end-surface electrode extends to the rear surface side and is integral with the land made of a metal film or other suitable material. In this case, the land is formed to have a sufficiently large area so as to be securely soldered to the motherboard side.

When the substrate as described above is mounted on a motherboard, a step of applying solder to the end-surface electrodes and lands is first performed before the substrate is mounted. In this solder-application step, after a predetermined amount of solder is adhered to each of the end surface electrodes, lands, and other elements of the substrate and is then melted, the solder is solidified in a protruding state in which the solder hangs downward from the land by its surface tension and its own weight.

Next, when this substrate is placed on the motherboard and is then heated while the protruding end of the solder is in contact with the motherboard side, the solder is melted and distorted between each land of the substrate and the motherboard, and as a result, the lands and the motherboard are soldered to each other. In this step, even when the substrate is deformed, for example, by warping, since the solder is sequentially melted and distorted, all solder is brought into contact with the motherboard side, and as a result, when the substrate is mounted thereon, the warping or other defects of the substrate can be absorbed by the solder in the protruding state.

According to the conventional technique described above, lands each having a sufficiently large area are formed on the substrate and are then soldered to the motherboard side, and hence the substrate can be securely mounted on the motherboard.

However, when the land having a large area is formed, in a solder-application step, since the solder expected to protrude toward the motherboard side spreads along the land to form a thin film, it is necessary to adhere a large amount of solder to the land. Otherwise, due to an insufficient protruding dimension of the solder, the warping or other defect of the substrate may not be absorbed in some cases, and as a result, connection defects of the land are likely to occur.

On the other hand, when a large amount of solder is adhered to the land, the consumption of the solder is unnecessarily increased, and in addition, short-circuiting may occur between adjacent lands by the solder which is melted and distorted between the land and the motherboard in a substrate mounting step. As a result, the increase of the amount of the solder has been limed to a certain level.

Accordingly, in the conventional technique, since it has been difficult to simultaneously obtain an appropriate land area and an appropriate protruding dimension of the solder, there have been problems in that the substrate cannot be mounted on the motherboard with a sufficient bonding strength or that the connections with the lands or other elements become unstable, resulting in degradation of reliability.

SUMMARY OF THE INVENTION

In order to overcome the problems described above, preferred embodiments of the present invention provide a circuit board device and mounting method therefor having improved reliability. In the circuit board device of preferred embodiments of the present invention, even when the land area is increased, the protruding dimension of the solder can be sufficiently secured on the land in a substrate mounting step, and the bonding strength of the substrate to the land can be increased, thereby forming a stable connection therebetween.

To these ends, in accordance with one a preferred embodiment of the present invention, a circuit board device includes a substrate having a front surface on which an electronic component is mounted, a rear surface to be mounted on a motherboard, and end surfaces, end-surface electrodes which are provided on the end surfaces and to which the electronic component is connected, and lands which are provided on the rear surface and are connected to the end-surface electrodes and which are to be soldered to the motherboard together with the end-surface electrodes.

In the circuit board device of this preferred embodiment of the present invention described above, the lands each have a mainland connected to the corresponding end-surface electrode described above and a sub-land disposed at a distance from the end-surface electrode, and partitions are each provided on the rear surface for separating the mainland from the sub-land.

According to the circuit board device described above, before the substrate is mounted on the motherboard, the solder can be applied, for example, from the end-surface electrode to the mainland, and in this step, the solder melted can be prevented by the partition from flowing from the mainland into the sub-land. Accordingly, since the solder which remains on the mainland can be solidified in the state in which the solder protrudes downward by its surface tension and its own weight, in a substrate mounting step, this protruding portion of the solder can be melted while being in contact with the motherboard, and as a result, the warping or other defect of the substrate can be ignored. In addition, the solder pushed out from between the mainland and the motherboard overflows the partition into the sub-land, and hence both the mainland and the sub-land, which have a large area, can be securely soldered to the motherboard side.

In the circuit board device described above, the mainland and the sub-land may be integrally formed from one metal film, and the partitions may each include a resist member provided on the metal film and between the mainland and the sub-land.

Accordingly, the resist member used as the partition can be formed on the metal film by etching or other suitable process, and by this resist member, the metal film can be separated into the mainland and the sub-land.

In the circuit board device described above, the mainland and the sub-land may be integrally formed from one metal film, and the partitions may each include a silk member provided on the metal film and between the mainland and the sub-land.

Accordingly, the silk member used as the partition can be formed on the metal film by silk-screen printing or other suitable process, and by this silk member, the metal film can be separated into the mainland and the sub-land.

In the circuit board device described above, the mainland and the sub-land may be formed of metal films spaced at a distance from each other, and the partitions are gaps each formed between the metal films. Accordingly, two metal films used for the mainland and the sub-land can be formed, for example, by etching, and the gap formed therebetween can be used as the partition.

According to the circuit board device described above, the partitions each may have a notch portion extending from the mainland side toward the sub-land side.

As a result, when the substrate is mounted, solder may be concentrated at the notch portion so as to promote the flow of the solder from the mainland to the sub-land, and hence the solder surely overflow the partitions. In addition, since a position through which the solder flows is limited only to the notch portion, even when the mainlands are disposed at small intervals, the solder will not flow into adjacent mainlands, and hence short-circuiting therebetween can be avoided.

According to the circuit board device described above, the sub-land may have curved portions having a curved shape that is separate from the corresponding partition. Hence, when the substrate is mounted, areas (hereinafter referred to as "non-coated areas" in some cases) to which the solder is not applied are not formed around the corners of the sub-land, and hence the entire surface thereof can be securely covered with the solder.

According to another preferred embodiment of the present invention, in a circuit board device, there are provided lands each including a mainland connected to the end-surface electrode and a plurality of sub-lands which are connected to the mainland and extend in the direction opposite thereto.

Accordingly, in a step of applying solder to the substrate, only a small portion of the solder adhered to the mainland flows into each sub-land, in which the amount of the solder corresponds, for example, to the area, the width dimension, and the like of each sub-land. Hence, in the sub-land, a thin portion (expansion portion) in which the solder spreads along the sub-land can be formed. In a step of mounting the substrate on the motherboard, when being melted, the solder provided between the substrate and the motherboard is first melted and distorted, thereby bonding the mainlands to the motherboard. In addition, since each sub-land is in the state of solder wetting as the expansion portion of the solder is melted, an excess solder distorted from between the mainland and the motherboard and pushed out therefrom can be spread smoothly along each sub-land which is in the state of solder wetting.

In addition, according to the circuit board device described above, the mainland may have a substantially circular or a substantially oval shape. Accordingly, for example, when a predetermined amount of the solder is protruded downward while being adhered to the mainland, the protruding dimension of the solder can be made largest when being compared to any lands having various shapes.

According to another preferred embodiment of the present invention, in a circuit board device, there are provided lands each having one of a substantially circular shape or a substantially oval shape in which the substantially circular arc portion thereof is larger than that having a central angle of 180°. Accordingly, compared to lands having shapes other than that described above, the solder can be most protruded downward. In addition, a mainland having a large area can be formed, and the protruding dimension of the solder can also be easily determined in accordance with the width dimension (diameter) or other characteristic of the mainland.

A method for mounting a circuit board device on a motherboard, in accordance with another preferred embodiment of the present invention, is applied to a circuit board device including a substrate having a front surface on which an electronic component is mounted, a rear surface to be mounted on the motherboard, and end surfaces, end-surface electrodes which are provided on the end surfaces and to which the electronic component is connected, lands which are provided on the rear surface and are connected to the end surface electrodes and which are to be soldered to the motherboard together with the end-surface electrodes, the lands each including a mainland connected to each of the end-surface electrodes and a sub-land disposed at a distance therefrom, and partitions each provided on the rear surface for separating the mainland from the sub-land.

The method described above of preferred embodiments of the present invention includes the steps of applying solder to the end-surface electrodes and the mainlands so as to form protruding portions which are composed of the solder covering the mainlands and which protrude from the rear surfaces, placing the circuit board device on the motherboard in the state in which the protruding portions face respective wire patterns of the motherboard, melting the solder so as to adhere to the wire patterns of the motherboard, and allowing the solder present at the mainland sides to flow over the partitions and into the respective sub-lands, whereby the mainlands and the respective sub-lands are connected to the respective wire patterns of the motherboard.

According to the structure described above, since the solder is applied to the end-surface electrodes and the mainlands before the substrate is mounted on the motherboard, the solder covering the mainlands can be solidified while protruding downward by its surface tension and by its own weight, thereby forming the protruding portions of the solder. Hence, when the substrate is mounted on the motherboard, the solder can be melted while each protruding portion of the solder is in contact with the corresponding wire pattern, and hence the warpage, warping, warp or other defects of the substrate are ignored. In addition, since the solder pushed out from between the mainland and the motherboard overflows the partition into the sub-land and adheres thereto, both the mainland and the sub-land, which have a large area, can be soldered to the corresponding wire pattern of the motherboard.

In addition, a method for mounting a circuit board device on a motherboard, in accordance with another preferred embodiment of the present invention, is applied to a circuit board device including a substrate having a front surface on which an electronic component is mounted, a rear surface to be mounted on the motherboard, and end surfaces, end-surface electrodes which are provided on the end surfaces and to which the electronic component is connected, lands which are provided on the rear surface and are connected to the end-surface electrodes and which are to be soldered to the motherboard together with the end-surface electrodes, the lands each including a mainland connected to each of the end-surface electrodes and sub-lands which are connected to the mainland and extend in the direction opposite thereto.

The method described above of a preferred embodiment of the present invention includes the steps of applying solder to the end-surface electrodes, the mainlands, and the sub-lands so as to form protruding portions, which are composed of the solder covering the mainlands and which protrude from the rear surfaces, and thin extending portions which are composed of the solder covering the sub-lands, placing the circuit board device on the motherboard in the state in which the protruding portions face respective wire patterns of the motherboard, melting the solder so as to adhere to the wire patterns, and allowing the solder present at the mainland sides to flow into the sub-land sides, whereby the mainlands and the respective sub-lands are connected to the respective wire patterns of the motherboard.

Accordingly, when the solder is applied to the substrate, of the solder adhered to the mainland, for example, a small amount of the solder corresponding to the area, width dimension, and the other portions of each sub-land flows therein. Hence, in the sub-land, the thin extending portion composed of the solder extending along the sub-land, is formed. In a step of mounting the substrate on the motherboard, when the solder is melted, the solder at the mainland side is distorted between the substrate and the motherboard, thereby connecting the mainland to the corresponding wire pattern of the motherboard. In addition, each sub-land is in the state of solder wetting since the extending portion of the solder is melted, and hence excess solder distorted between the mainland and the motherboard and pushed out from therebetween can extend smoothly along each sub-land. As a result, both the mainland and the sub-lands, having a large area, can be soldered to the corresponding wire pattern of the motherboard.

Other features, elements, characteristics and advantages of the present invention will become more apparent from the following detailed description of preferred embodiments thereof with reference to the attached drawings.

DETAILED DESCRIPTION OF PREFERRED EMBODIMENTS

Figure 1:
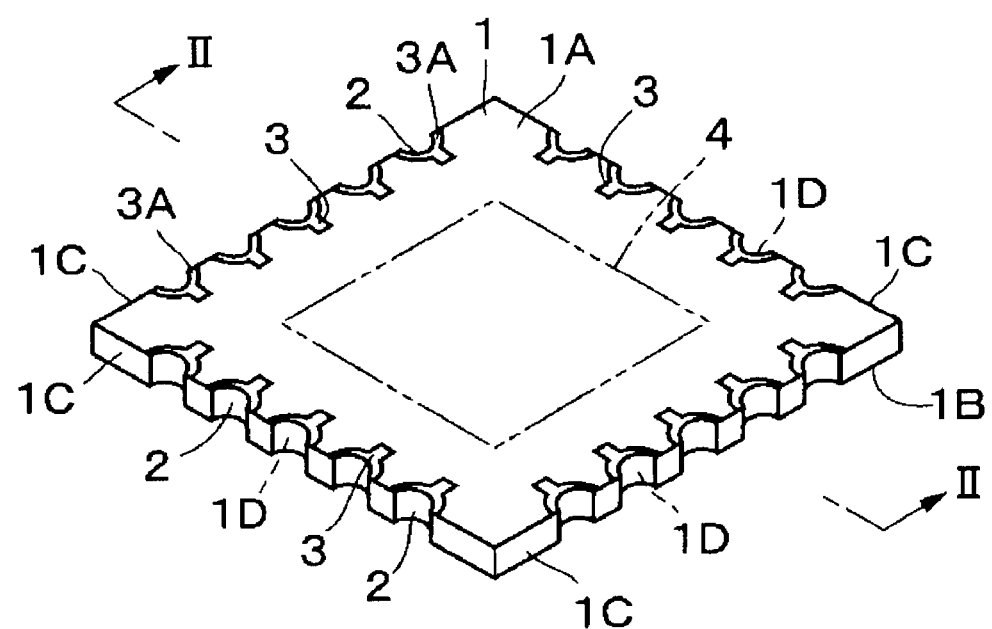
FIG. 1 is a perspective view showing a circuit board device of a first preferred embodiment of the present invention.
Figure 2:
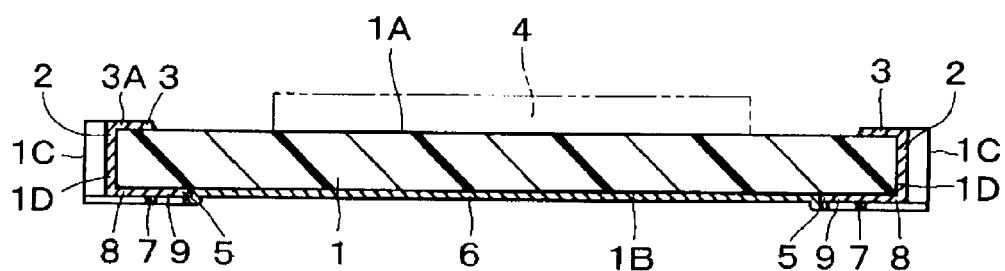
FIG. 2 is a vertical cross-sectional view of the circuit board device when viewed in the direction indicated by the arrow II—II in FIG. 1.
Figure 3:
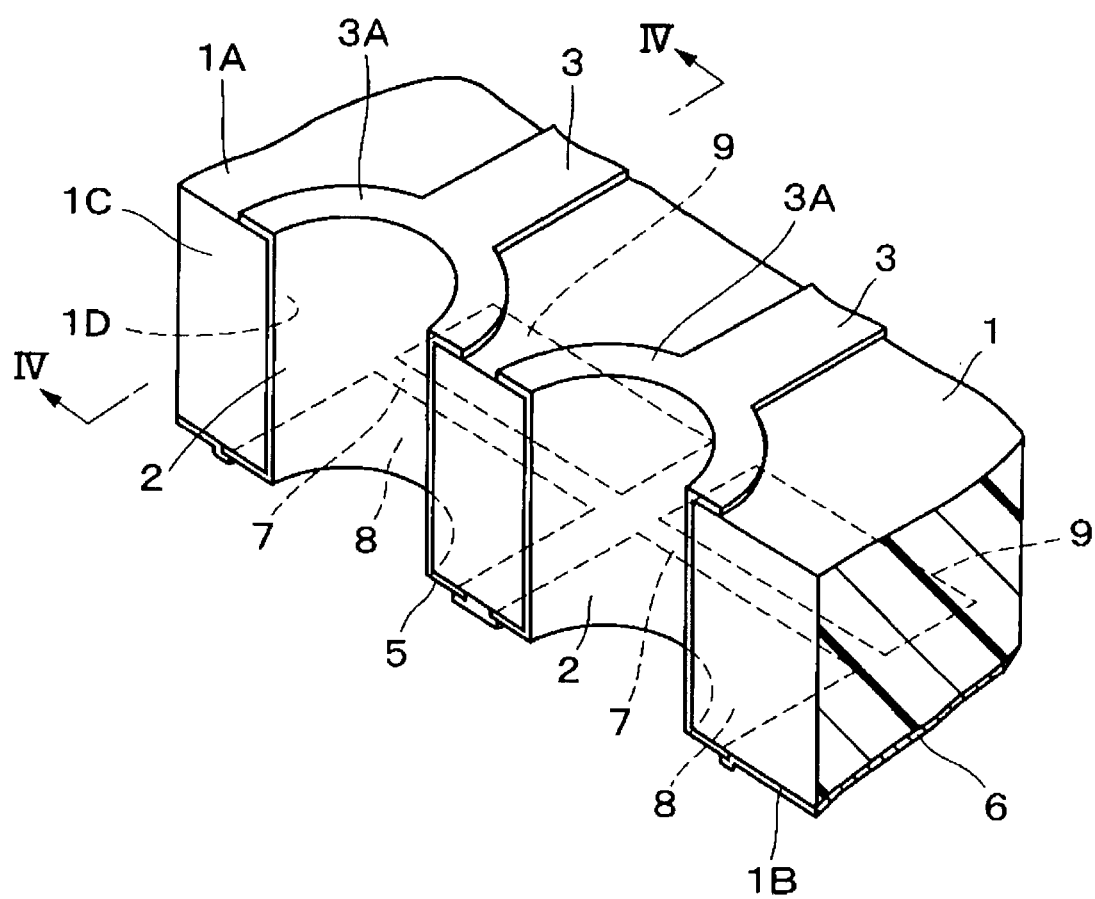
FIG. 3 is a partly enlarged perspective view of end-surface electrodes and the vicinity thereof shown in FIG. 1.

Hereinafter, circuit board devices of preferred embodiments according to the present invention will be described in detail with reference to accompanying drawings.

Referring to FIGS. 1 to 9, a first preferred embodiment of the present invention will be described, and in this preferred embodiment, examples in which the circuit board devices are applied to module substrates will be described.

Reference numeral 1 indicates a module substrate defining a substrate constituting a major portion of a circuit board device, and as shown in FIGS. 1 to 4, the module substrate 1 is preferably a substantially rectangular flat plate composed, for example, of an insulating resin material and has a front surface 1A, a rear surface 1B, and four end surfaces 1C. In addition, in each end surface 1C of the substrate 1, a plurality of grooves 1D in the form, for example, of a substantially semicircle is arranged at predetermined intervals, and each groove 1D extends in the thickness direction of the substrate 1 and has openings at the front surface 1A and the rear surface 1B.

Reference numeral 2 indicates a plurality of end-surface electrodes provided on each end surface 1C of the module substrate 1 at predetermined intervals, and the end-surface electrodes 2 are formed, for example, by plating metal films in a substantially semicircular shape in the grooves 1D of the substrate 1 and extend in the thickness direction thereof. In addition, one end in the longitudinal direction of each of the end-surface electrodes 2 is connected to a corresponding wire pattern 3 described below, and the other end is connected to a main land 8 described later Reference numeral 3 indicates a plurality of wire patterns provided on the front surface 1A of the module substrate 1, and each wire pattern 3 is formed, for example, of a strip-shaped metal film and has at end portion thereof a substantially semicircular connection portion 3A which is connected to the end-surface electrode 2 at a position surrounding the corresponding groove 1D.

Reference numeral 4 indicates an electronic component mounted on the front surface 1A of the module substrate 1, and the electronic component 4 includes a plurality of elements including active elements such as semiconductor ICs, or transistors, or passive elements such as resistors, capacitors, or coils, and is connected to the end-surface electrodes 2 through the respective wire patterns 3 and other type of connections.

In addition, the electronic component 4 is subassembled on the substrate 1 and is then mounted on a motherboard 10 described later. In addition, the electronic component 4 is connected to wire patterns 11 on the motherboard 10 through the end-surface electrodes 2 and other elements of the module substrate 1.

Figure 4:
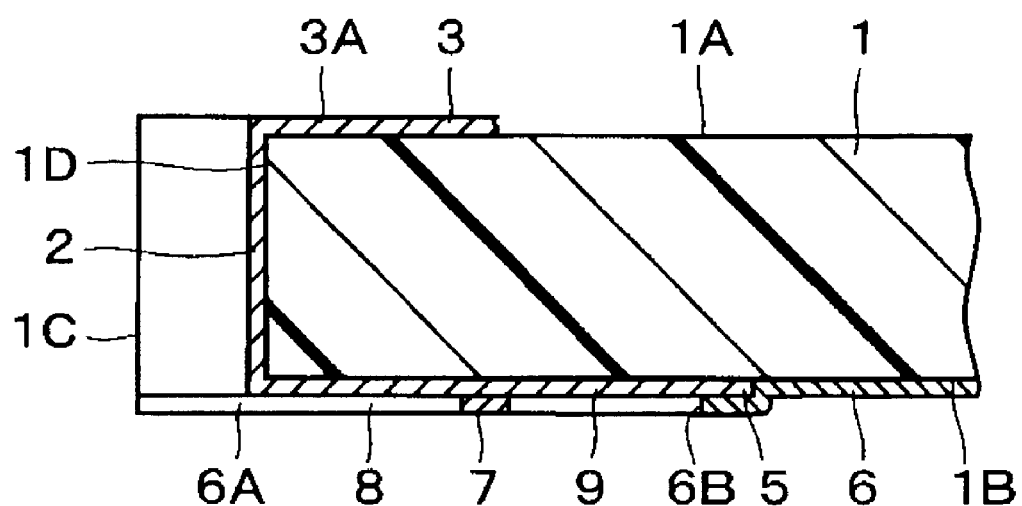
FIG. 4 is a partly enlarged cross-sectional view of the circuit board device when viewed in the direction indicated by the arrow IV—IV in FIG. 3.
Figure 5:
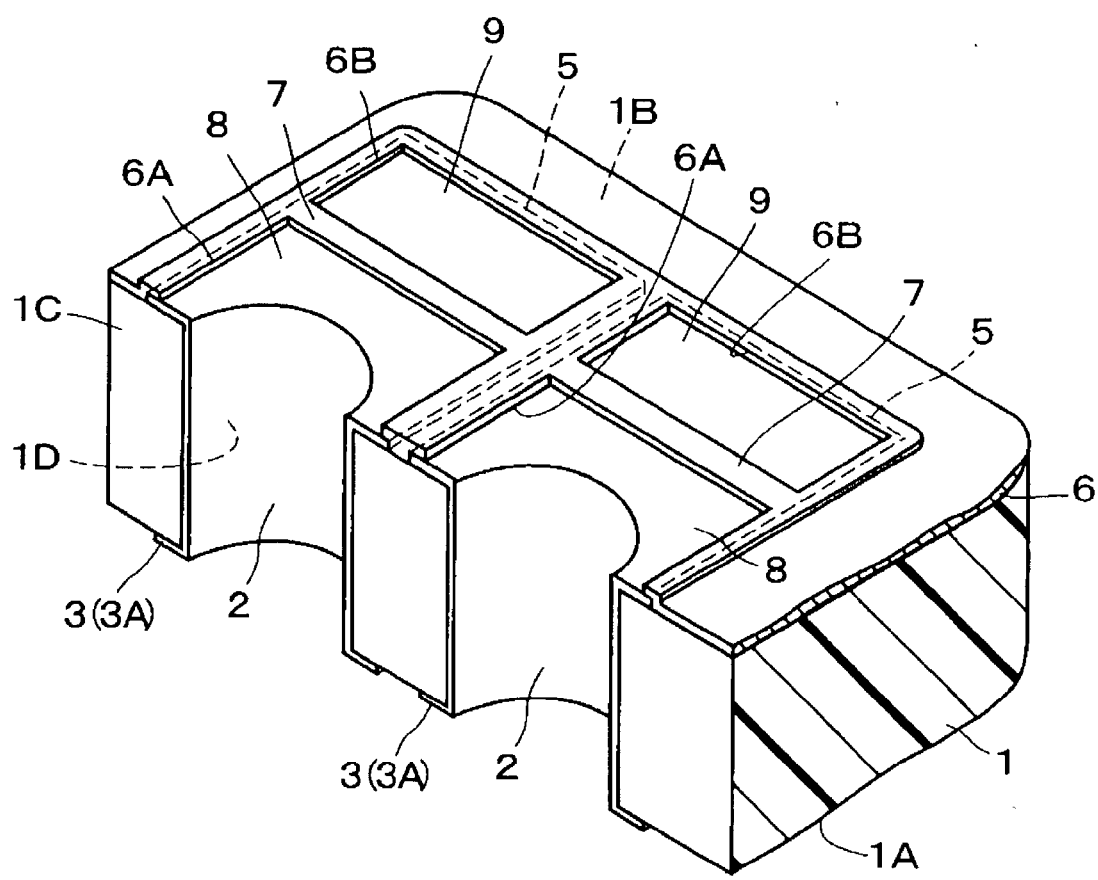
FIG. 5 is a partly enlarged perspective view of a rear surface side of a module substrate.
Figure 6:
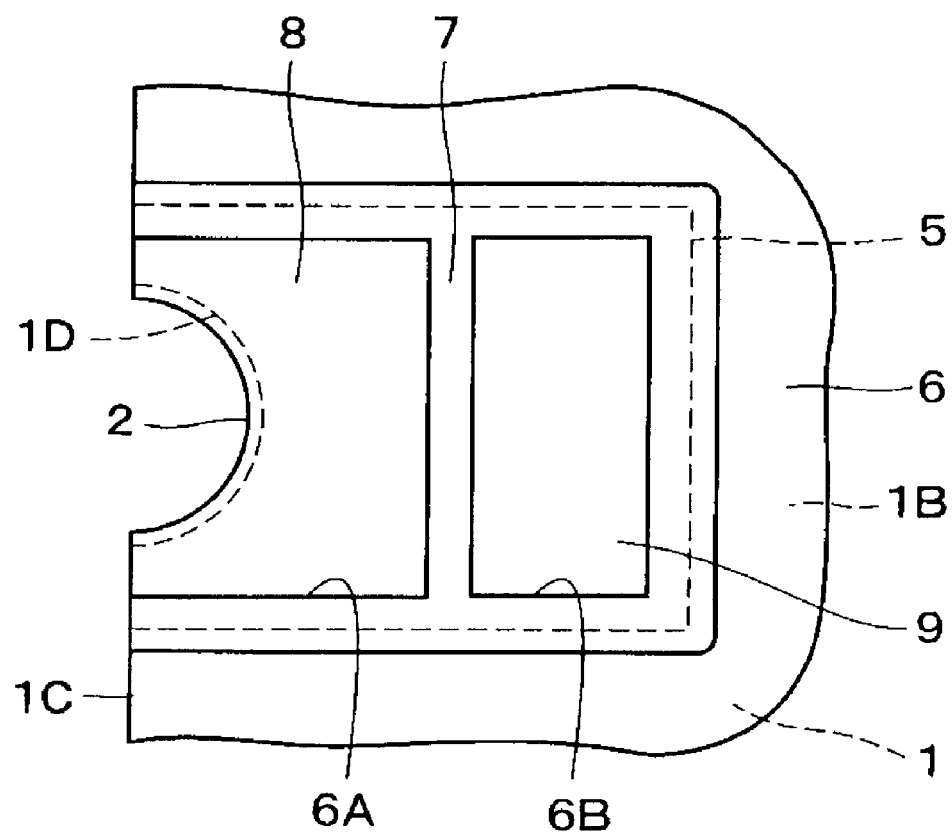
FIG. 6 is a partly enlarged bottom view of a rear surface side of a module substrate.

Reference numeral 5 indicates a plurality of metal films provided on the rear surface 1B of the module substrate 1 for forming lands 8 and 9 described later, and as shown in FIG. 4 to 6, the metal films 5 are in the form, for example, of a substantially rectangular thin-film and are provided at predetermined intervals, each of the metal films extending inside from the periphery of the substrate 1 at a position corresponding to the end-surface electrode 2. In addition, the metal films 5 are each connected to the corresponding end-surface electrode 2 at a position surrounding the groove 1D of the substrate 1.

Reference numeral 6 indicates a resist film provided on the rear surface 1B of the module substrate 1, and the resist film 6 is formed, for example, of an insulating resist material and covers the rear surface 1B of the substrate 1 including portions of the metal films 5. In addition, substantially rectangular openings 6A and 6B are formed in the resist film 6 on each metal film 5, and the openings 6A and 6B are formed at a distance from each other in the longitudinal direction of the metal film 5.

Reference numeral 7 indicates partitions each including a portion of the resist film 6 which is located at a position between the openings 6A and 6B so as to separate the openings 6A and 6B from each other, and the partition 7 is a strip-shaped wall which crosses the metal film 5 in the midway along the longitudinal direction thereof and which protrudes downward from the metal film 5 toward the motherboard 10.

As described above, the partitions 7 separate each of the metal films 5 into a mainland 8 and a sub-land 9, which will be described later. Accordingly, in a solder-application step shown in FIG. 7, solder 12 on the mainland 8 is prevented by the partition 7 from flowing into the sub-land 9 side, and in a soldering step shown in FIGS. 8 and 9, the solder 12 pushed out from between the mainland 8 and the motherboard 10 is allowed to flow over the partition 7 so as to adhere to the sub-land 9.

Reference numeral 8 indicates a plurality of mainlands provided on the rear surface 1B of the module substrate 1, and each mainland 8 is a portion of the metal film 5 in a substantially rectangular shape exposed in the opening 6A of the resist film 6 and is connected to the corresponding end-surface electrode 2 at the periphery of the substrate 1. In addition, in the solder-application step, the mainland 8 maintains the solder 12, which flows from the end-surface electrode 2 side, in the state in which the solder 12 is largely protruded downward Reference numeral 9 indicates a plurality of sub-lands each provided in the vicinity of the corresponding mainland 8 on the rear surface 1B of the module substrate 1, and each sub-land 9 is a portion of the metal film 5 having a substantially rectangular shape exposed in the opening 6B of the resist film 6 and is separated from the mainland 8 by the partition 7. In addition, the sub-land 9 is provided at a position further from the end-surface electrode 2 than that of the mainland 8.

In addition, the sub-lands 9 are each connected to the corresponding wire pattern 11 of the motherboard 10 with the solder 12 together with the end-surface electrode 2 and the mainland 8. As a result, the lands 8 and 9, which have a large connection area, can be reliably connected to the wire pattern 11. In this case, since the mainland 8 and the corresponding sub-land 9 are disposed in the openings 6A and 6B, respectively, which are recessed from the surface of the resist film 6 by the thickness thereof, the module substrate 1 can prevent the solder 12, which flows into the lands 8 and 9, from spreading outside, and hence the solder 12 can be stably disposed on the lands 8 and 9.

Figure 8:
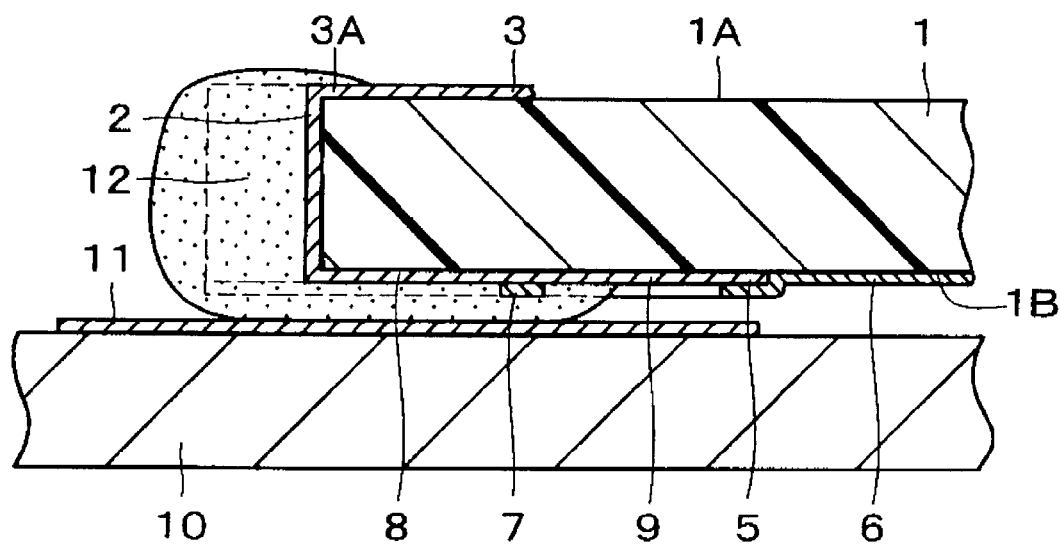
FIG. 8 is a partly enlarged cross-sectional view showing the state in which solder provided on a module substrate is melted so as to be brought into contact with a motherboard in a substrate mounting step.
Figure 9:
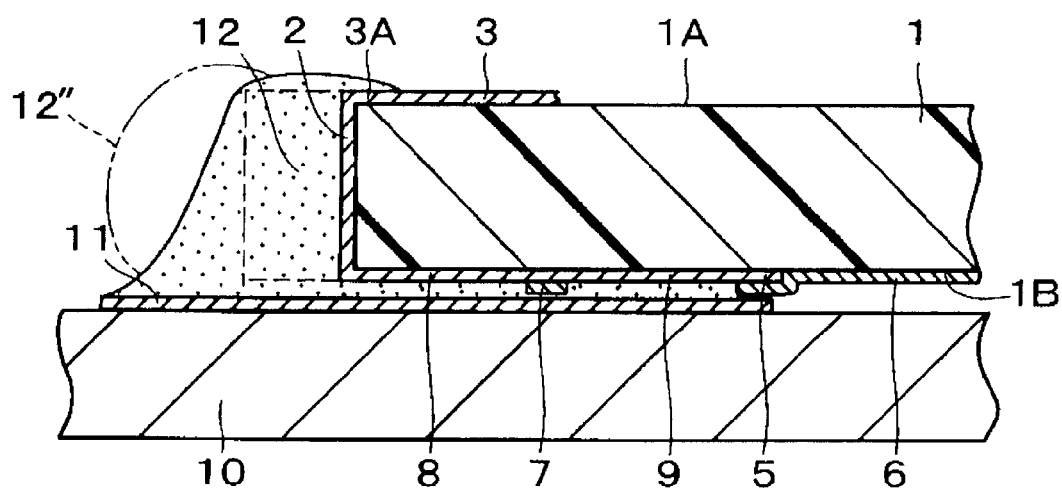
FIG. 9 is a partly enlarged cross-sectional view showing the state in which a module substrate is mounted on a motherboard.

Reference numeral 10 indicates a motherboard on which the module substrate 1 is mounted, and as shown in FIGS. 8 and 9, a plurality of the wire patterns 11 (only one wire pattern is shown in the figure), another electronic circuit (not shown), and other elements are provided on the motherboard 10. To these wire patterns 11, the end-surface electrodes 2 and the lands 8 and 9 are connected with the solder 12.

The circuit board device of this preferred embodiment has the structure as described above, and subsequently, referring to FIGS. 7 to 9, a process for mounting the module 1 will be described.

Figure 7:
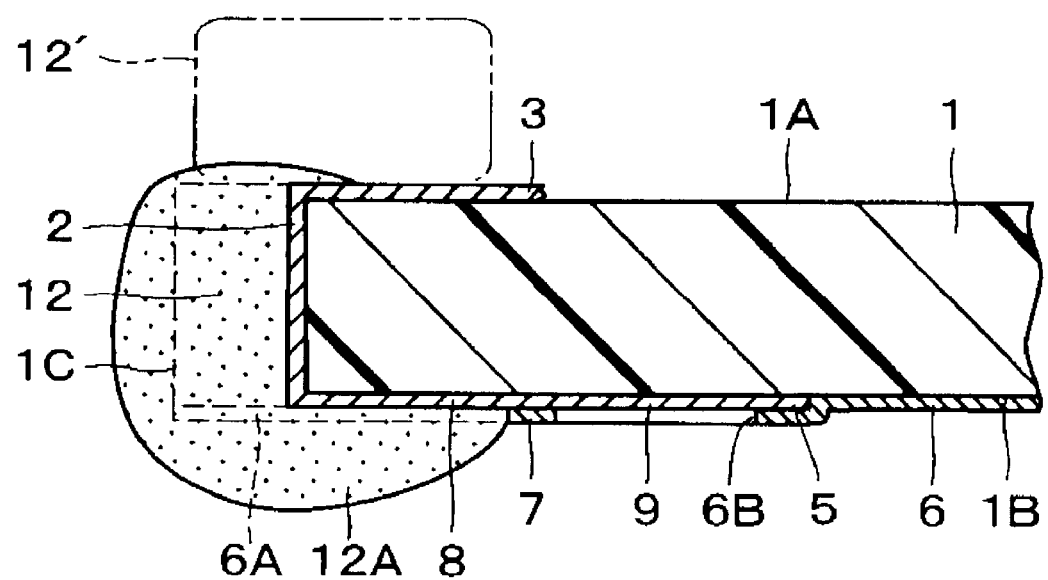
FIG. 7 is a partly enlarged cross-sectional view showing the state in which solder is applied to an end-surface electrode, a mainland, and other portions in a solder-application step.

First, in the solder-application step shown in FIG. 7, for example, a granular solder material 12' is disposed at a position corresponding to the connection portion 3A of each wire pattern 3 and is then melted. As a result, as shown by the solid line shown in FIG. 7, the solder 12 obtained by melting the solder material 12' flows from the connection portion 3A to the mainland 8 through the end-surface electrode 2 and extends along a portion having good wettability for the solder 12.

In this step, since the flow of the solder 12 from the mainland 8 to the sub-land 9 is controlled by the partition 7, a portion of the solder 12, which reaches the mainland 8, remains thereon. Subsequently, this portion of the solder 12 hangs from the mainland 8 by its surface tension and its own weight to form a protruding portion 12A that largely protrudes downward, and the solder 12 in the state described above is then solidified. In this case, the protruding dimension of the protruding portion 12A can be adjusted, for example, in accordance with the area ratio of the connection portion 3A to the mainland 8, the amount of the solder material 12', and the viscosity.

Next, in a substrate mounting step shown in FIGS. 8 and 9, the module substrate 1 is first placed on the motherboard 10 so that each protruding portion 12A of the solder 12 faces the wire pattern 11 and then is brought into contact with the wire pattern 11.

When the solder 12 in contact with the wire pattern 11 is heated, as shown in FIG. 8, the protruding portion 12A of the solder 12 is melted and is distorted between the mainland 8 and the wire pattern 11, and as a result, the end-surface electrode 2 and the mainland 8 are connected to the wire pattern 11 with the solder 12. In this case, for example, even when some protruding portions 12A exist which are not in contact with the wire patterns 11 because of the warping of the substrate 1 and/or the motherboard 10, since being sequentially melted and distorted, every protruding portion 12A of the solder 12 is brought into contact with the mainland 8 and the wire pattern 11 Consequently, the warping and other defect of the substrate 1 can be ignored, and hence every end-surface electrode 2 of the substrate 1 can be reliably connected to the wire pattern 11 of the motherboard 10.

In addition, when the solder 12 is melted and distorted between the mainland 8 and the wire pattern 11, the solder 12 is then distorted by the weights of the module substrate 1 and the electronic component 4, thereby generating a force facilitating the solder to extend along the wire patterns 11 in addition to a force of facilitating the flow of the solder out of the mainland 8. Hence, being pushed out from therebetween, the solder 12 overflows the partition 7 into the sub-land 9, and as a result, the sub-land 9 and the wire pattern 11 are connected to each other by the solder 12.

As a result, in the state in which the module substrate 1 is mounted on the motherboard 10, as shown in FIG. 9, in addition to the connection between each end-surface electrode 2 and the corresponding wire pattern 11, the mainland 8 and the sub-land 9, which have a large connection area, can be connected to the wire pattern 11 where the end-surface electrode 2 and the corresponding wire pattern 11 are connected.

Accordingly, in this preferred embodiment, since the partition 7 is provided on the rear surface 1B of the module substrate 1 for separating the metal film 5 into the mainland 8 and the sub-land 9, for example, when the solder 12 is applied to the substrate 1 before assembly, the flow of the solder 12 from the mainland 8 to the sub-land 9 side can be controlled by the partition 7, and hence a sufficient amount of the solder 12 can remain on the mainland 8. As a result, the protruding portion 12A of the solder 12, which largely protrudes downward, can be solidified.

As a result, when the substrate 1 is mounted on the motherboard 10, even when those are deformed by warping or other defect, the end-surface electrode 2 and the mainland 8 can be reliably connected to the wire pattern 11 at the motherboard 10 side, and hence connection defects thereof can be reliably prevented.

In addition, since the solder 12 overflows the partition 7 when the substrate 1 is mounted, both the mainland 8 and the sub-land 9 can be soldered to the wire pattern 11, and a large connection area formed by soldering can be secured therebetween, so that the substrate 1 can be mounted on the motherboard 10 with a high strength. In addition, since an appropriate amount of the solder 12 is allowed to remain in an area from the end-surface electrode 2 to the mainland 8, a fillet having an appropriate cross-sectional shape such as an approximate triangle can be securely formed so as to improve the connection strength between the substrate 1 and the motherboard 10, and in addition, peeling therebetween caused by vibration, impact, and other causes can also be prevented.

Accordingly, for example, even when the structure is formed in which the area of the mainland 8 is decreased so that the protruding portion 12A of the solder 12 largely protrudes from the mainland 8, since the connection strength of the substrate 1 can be sufficiently secured by the two lands 8 and 9, a preferable protruding dimension of the solder 12 and connection areas of the lands 8 and 9 can be easily obtained at the same time, thereby improving the reliability.

In addition, since the partitions 7 are each formed of a resist material, for example, by simply etching the resist film 6 provided on the metal film 5, the partition 7 having accurate dimensions can be easily formed.

As a comparative example for the sake of comparison, the case in which the partitions 7, the sub-lands 9, and other elements are not formed will be described by way of example. In this case, for example, when a large amount of the solder material 12' is adhered to the mainland 8 in order to absorb the warping or other defects of the motherboard 10, solder 12" may be pushed out from the mainland 8, and as a result, for example, a spherical shape of the solder 12" may be formed in some cases as indicated by the virtual line shown in FIG. 9. In this state, even when a small impact or other force is applied to the solder 12", cracking is likely to occur therein, and as a result, the bonding strength between the substrate 1 and the motherboard 10 is decreased. However, in this preferred embodiment, since an appropriate amount of the solder 12 can be applied to the end-surface electrode 2 and the mainland 8, a fillet of the solder 12 having an appropriate shape can be formed.

Figure 10:
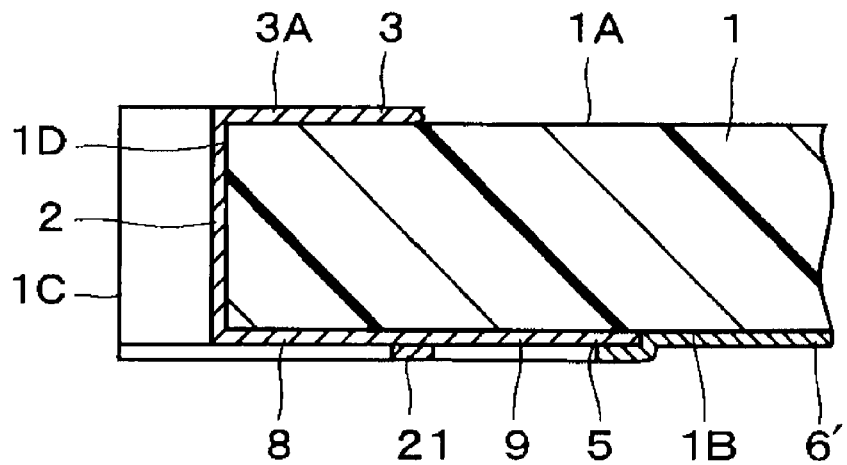
FIG. 10 is a partly enlarged cross-sectional view showing a circuit board device according to a second preferred embodiment of the present invention when viewed from the same position as that shown in FIG. 4.

Next, a second preferred embodiment of the present invention is shown in FIG. 10, and in this preferred embodiment, the partitions are each formed of a silk member. The same reference numerals of the constituent elements in the first preferred embodiment designate the same constituent elements in this preferred embodiment, and descriptions thereof are omitted.

Reference numeral 21 indicates a partition provided at the rear surface 1B side of the module substrate 1, and in a manner approximately equivalent to that in the first preferred embodiment, the partition 21 separates the metal film 5 into the mainland 8 and sub-land 9. However, the partition 21 is not a part of a resist film 6' and is formed, for example, by printing a silk member such as ink or paint on the metal film 5 by silk-screen printing or other suitable process.

By the structure of this preferred embodiment as described above, advantages approximately equivalent to those described in the first preferred embodiment can also be obtained. In addition, particularly in this preferred embodiment, the partition 21 can be easily formed, for example, by silk-screen printing, and hence the shape, dimensions, and other characteristics of the partition 21 can be more easily changed.

Figure 11:
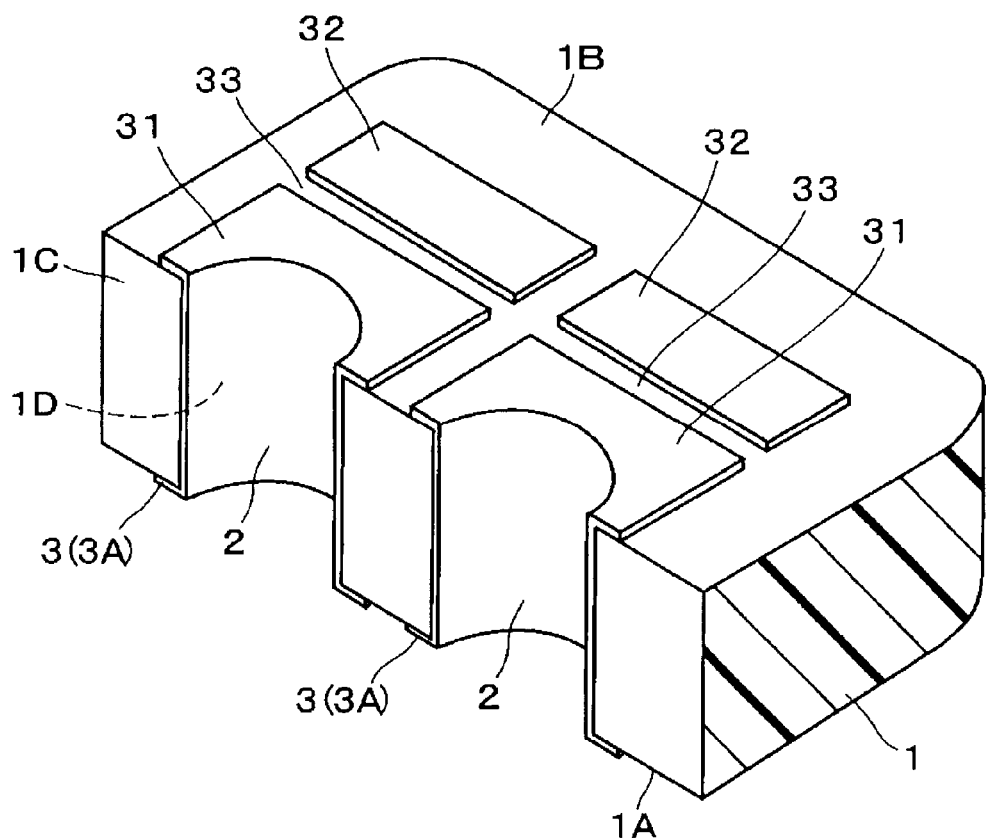
FIG. 11 is a partly enlarged perspective view showing a circuit board device according to a third preferred embodiment of the present invention when viewed from the same position as that shown in FIG. 5.

Next, a third preferred embodiment of the present invention is shown in FIG. 11, and in this preferred embodiment, the mainland is formed of a metal film that is different from that used for the sub-land, and the gap formed between the metal films described above is used as the partition. The same reference numerals of the constituent elements in the first preferred embodiment designate the same constituent elements in this preferred embodiment, and descriptions thereof are omitted.

Reference numeral 31 indicates a mainland provided at the rear surface 1B of the module substrate 1, and in a manner approximately equivalent to that in the first preferred embodiment, the mainland 31 is formed, for example, of an approximately rectangular metal film and is connected to the end-surface electrode 2 at the periphery of the substrate 1.

Reference numeral 32 indicates a sub-land which is formed, for example, of a metal film different from that for the mainland 31 and which is provided at the rear surface 1B side of the substrate 1. The sub-land 32 is provided inside the substrate 1 at a predetermined distance from the mainland 31 in a manner approximately equivalent to that in the first preferred embodiment.

Reference numeral 33 indicates a partition separating the mainland 31 from the sub-land 32, and the partition 33 is formed of the gap (space) between the lands 31 and 32.

With the structure of this preferred embodiment as described above, advantages approximately equivalent to those described in the first preferred embodiment can also be obtained. In addition, particularly in this preferred embodiment, since the partition 33 is defined by the gap between the lands 31 and 32, the structure of the partition 33 can be further simplified and can be easily formed.

Figure 12:
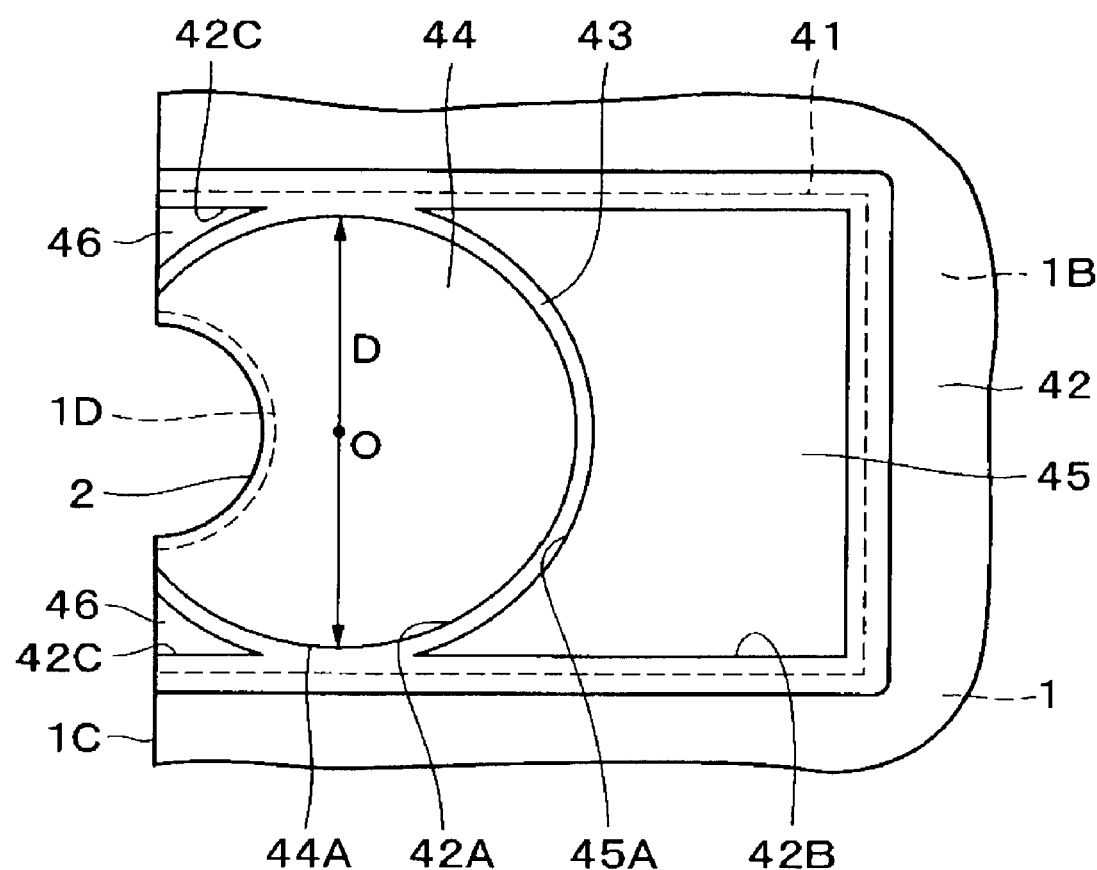
FIG. 12 is a partly enlarged bottom view showing a circuit board device according to a fourth preferred embodiment of the present invention when viewed from the same position as that shown in FIG. 6.

Next, a fourth preferred embodiment of the present invention is shown in FIG. 12, and in this preferred embodiment, the shape of the mainland is in an approximately circular shape having an area larger than that of a semicircular shape. The same reference numerals of the constituent elements in the first preferred embodiment designate the same constituent elements in this preferred embodiment, and descriptions thereof are omitted.

Reference numeral 41 indicates a substantially rectangular metal film provided at the rear surface 1B side of the module substrate 1, and in a manner approximately equivalent to that in the first preferred embodiment, the metal film 41 is connected to the end-surface electrode 2 at a position surrounding the groove 1D of the substrate 1.

Reference numeral 42 indicates a resist film provided at the rear surface 1B of the module substrate 1, and the resist film 42 covers the rear surface 1B of the substrate 1 including the peripheral portions and other portions of the metal films 41. In addition, an opening 42A having a substantially circular or an oval shape (hereinafter referred to as "approximately circular shape") and openings 42B and 42C, provided at positions surrounding the opening 42A, are formed in the resist film 42 on each metal film 41, and the entire shape defined by these openings 42A to 42C is an approximately rectangle slightly smaller than the metal film 41.

Reference numeral 43 indicates a partition formed of parting portions between the openings 42A and 42B and between the openings 42A and 42C. The partition 43, which is a thin and long wall in an approximately semicircular shape on the metal film 41, surrounds the opening 42A formed in the resist film 42 and protrudes downward from the metal film 41 to the motherboard side. In addition, in a manner approximately equivalent to that in the first preferred embodiment, the partition 43 separates the metal film 41 into a mainland 44 and sub-lands 45 and 46, which are described below.

Reference numeral 44 indicates a mainland provided at the rear surface 1B of the module substrate 1, and the mainland 44 is a portion of the metal film 41 exposed in the opening 42A formed in the resist film 42. In addition, the mainland 44 is arranged so as to surround the corresponding end-surface electrode 2 of the substrate 1 and is connected thereto.

In this preferred embodiment, the mainland 44 has an approximately circular shape surrounded by the partition 43. Hence, in a solder-application step, for example, when a predetermined amount of solder 12 is adhered to the mainland 44 so as to be protruded downward, the protruding dimension of the solder 12 can be made largest when being compared to any lands having various shapes. That is, for example, when solder is adhered to a substantially rectangular land, the solder spreads from the center to the four corners of each land to form a thin film, and the protruding dimension of the solder becomes small compared to that provided on the mainland 44. On the other hand, for example, by adhering a necessary minimum amount of solder to the mainland 44, the protruding dimension thereof can be made as large as possible.

In addition, the mainland 44 preferably has an approximately circular shape having an area, for example, larger than that of a substantially semicircular shape; a substantially circular arc portion 44A defining the periphery of the mainland 44 has a central angel larger than 180°; and the center O of this substantially circular arc portion 44A is disposed inside the substrate 1 and apart from the end surface 1C. In addition, the width dimension (the dimension that is substantially parallel to the end surface 1C of the substrate 1) of the mainland 44 becomes largest, equal to diameter D, at a position apart from the end surface 1C. As a result, in a solder-application step, a required amount of the solder 12 can be reliably adhered to the mainland 44 having a sufficiently large area, and the protruding dimension of the solder 12 can be optionally set to a desired value in accordance with diameter D of the mainland 44

Reference numeral 45 indicates a sub-land provided in the vicinity of the mainland 44, and the sub-land 45 is a portion of the metal film 41 exposed in the opening 42B formed in the resist film 42 on the substrate 1 and is disposed apart from the end-surface electrode 2. In addition, a portion of the periphery of the sub-land 45, which is adjacent to the mainland 44 with a predetermined gap left therebetween, has a substantially circular arc portion 45A in an approximately circular arc shape. Furthermore, on both sides of the mainland 44, other sub-lands 46, which are exposed in the openings 42C formed in the resist film 42, are provided along the end surface 1C of the substrate 1.

By the structure of this preferred embodiment as described above, advantages approximately equivalent to those described in the first preferred embodiment can also be obtained. In addition, particularly in this preferred embodiment, since the mainland 44 has an approximately circular shape having an area larger than that of a semicircular shape, for example, by simply adhering a necessary minimum amount of the solder 12 to the mainland 44 in a solder-application step, the protruding dimension of the solder 12 protruding downward from the substrate 1 can be made sufficiently large and can also be desirably adjusted in accordance with diameter D of the mainland 44. As a result, while the amount of the solder 12, which is adhered to the mainland 44, is appropriately controlled, soldering is accomplished regardless of warping or other defect of the module substrate 1 and the motherboard 10.

Figure 13:
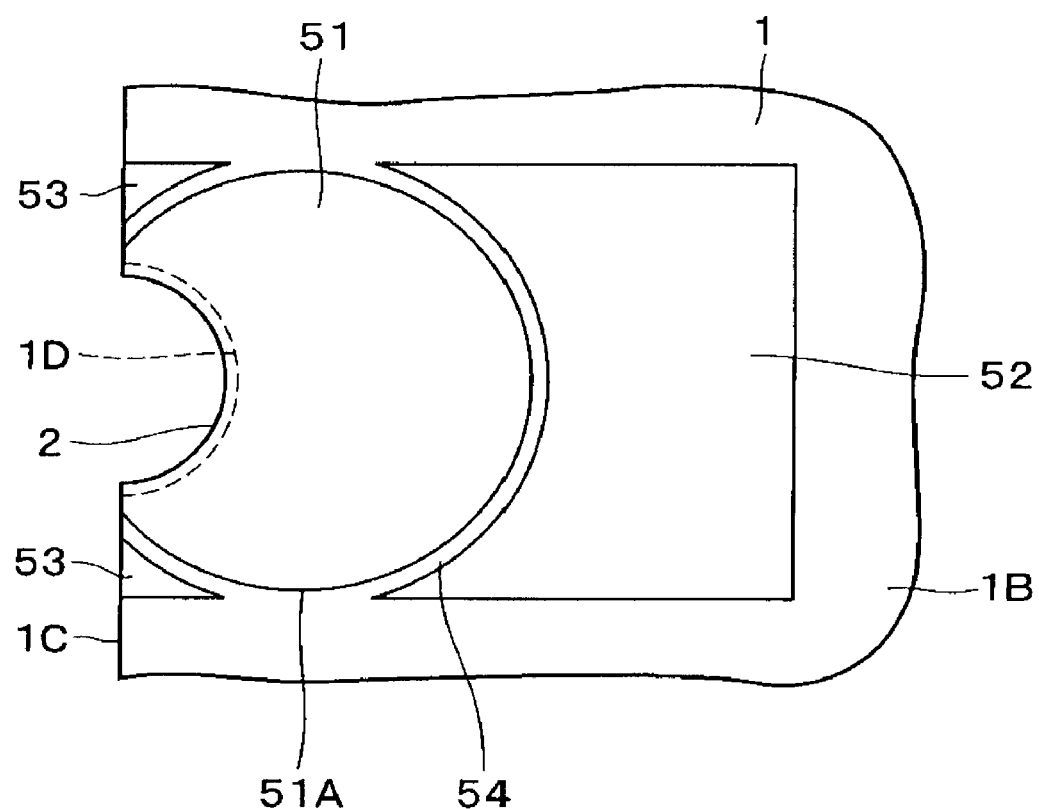
FIG. 13 is a partly enlarged bottom view showing a circuit board device according to a fifth preferred embodiment of the present invention.

Next, a fifth preferred embodiment of the present invention is shown in FIG. 13, and in this preferred embodiment, a mainland having an approximately circular shape is formed of a metal film that is different from that for a sub-land provided around the periphery of the mainland. The reference numerals of the constituent elements of the first preferred embodiment designate the same constituent elements in this preferred embodiment, and descriptions thereof are omitted.

Reference numeral 51 indicates a mainland provided at the rear surface 1B side of the module substrate 1, and in a manner approximately equivalent to that in the fourth preferred embodiment, the mainland 51 is formed, for example, of a metal film having an approximately circular shape, has a substantially circular arc portion 51A having a center angle larger than about 180°, and is connected to the end-surface electrode 2 of the substrate 1.

Reference numerals 52 and 53 indicate sub-lands provided in the vicinity of the mainland 51, and in a manner approximately equivalent to that in the fourth preferred embodiment, the sub-lands 52 and 53 are each disposed apart form the end-surface electrode 2 and at a predetermined distance from the mainland 51 In addition, the lands 51, 52, and 53 are formed of metal films that are different from each other.

Reference numeral 54 indicates a partition having an approximately circular shape separating the mainland 51 from the sub-lands 52 and 53, and the partition 54 1s a gap formed between the mainland 51 and the sub-lands 52 and 53.

By the structure of this preferred embodiment as described above, advantages approximately equivalent to those described in the first, third, and fourth preferred embodiments can also be obtained.

Figure 14:
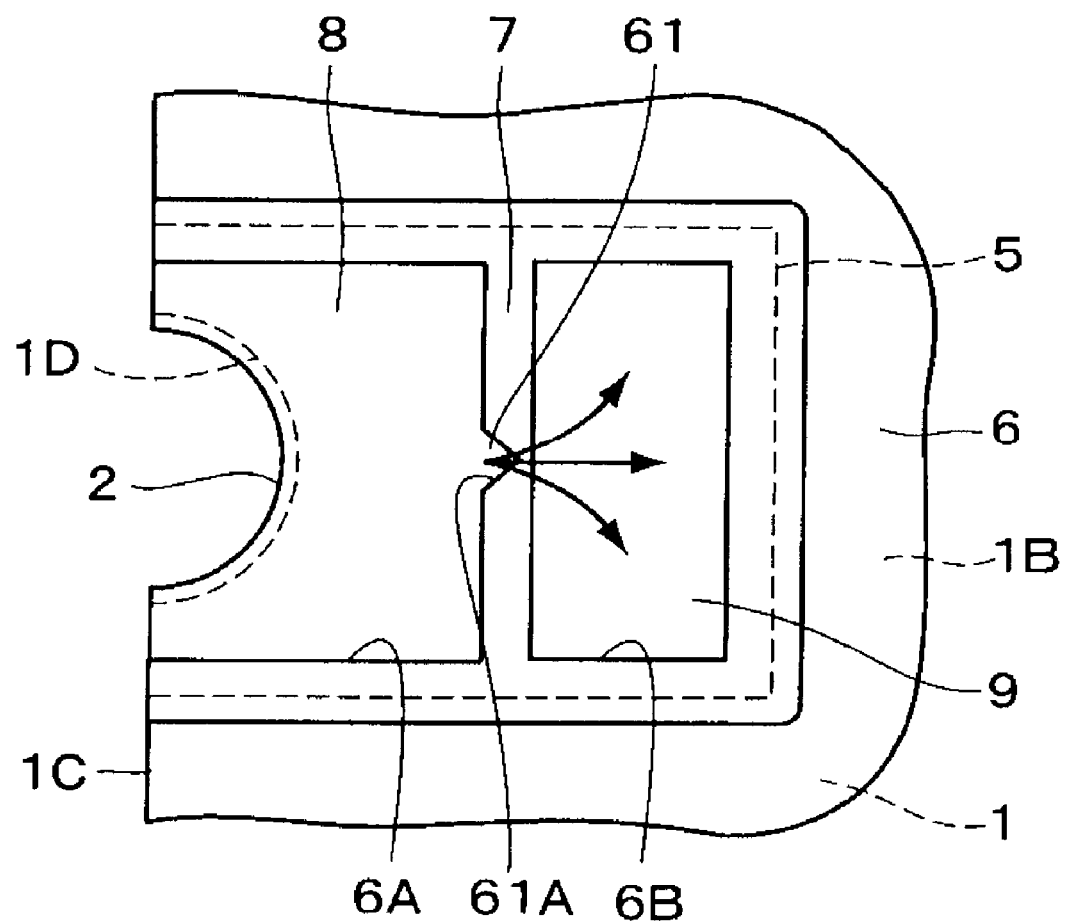
FIG. 14 is a partly enlarged bottom view showing a circuit board device according to a sixth preferred embodiment of the present invention.

Next, a sixth preferred embodiment of the present invention is shown in FIG. 14, and in this preferred embodiment, a partition having a notch portion extending from the mainland side toward the sub-land side is formed. The same reference numerals of the constituent elements in the first preferred embodiment designate the same constituent elements in this preferred embodiment, and descriptions thereof are omitted.

Reference numeral 61 indicates a notch portion formed in the partition 7, and for example, the notch portion 61 is formed approximately at the central position in the length direction of the partition 7 extending so as to traverse the metal film 5. This notch portion 61 is a cut 61A having an approximately triangular shape which tapers (the distance between the two sides of the triangular shape is gradually decreased) from the mainland 8 side toward the sub-land 9 side. In addition, the notch portion 61 is formed at a position corresponding to an exposed triangular portion of the metal film 5, which is exposed at the position of the cut 61A, so as to directly face the mainland 8.

With the structure of this preferred embodiment as described above, advantages approximately equivalent to those described in the first preferred embodiment can also be obtained. Since the notch portion 61 is provided for the partition 7 in this preferred embodiment, when the substrate 1 is mounted, as indicated by the arrow shown in FIG. 14, the solder 12 can be concentrated at the notch portion 61 so as to facilitate the flow of the solder 12 from the mainland 8 toward the sub-land 9. Hence, even when a force pushing out the solder 12 is small since the module substrate 1 and the electronic component 4 are lightweight, the solder can reliably overflow the partition 7.

In addition, since a position through which the solder 12 flows can be limited only to the notch portion 61, even when the mainlands 8 are disposed at small intervals, the solder will not overflow into adjacent mainlands 8. Hence, short-circuiting therebetween can be avoided so as to improve the isolation, resulting in the improvement in reliability.

Figure 15:
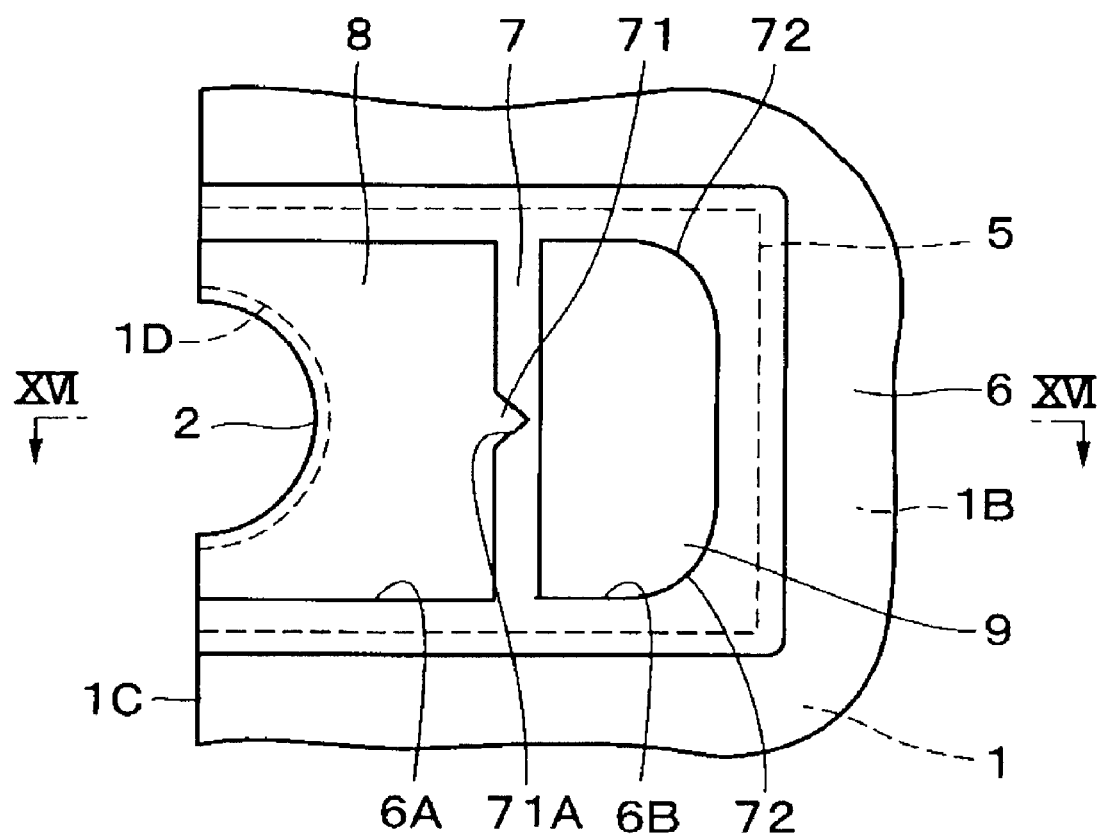
FIG. 15 is a partly enlarged bottom view showing a circuit board device according to a seventh preferred embodiment of the present invention.
Figure 16:
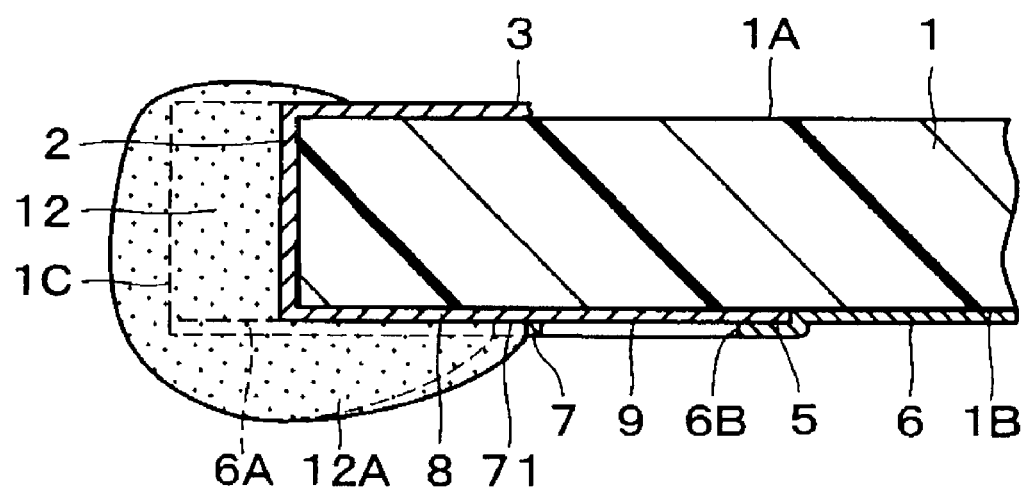
FIG. 16 is a partly enlarged cross-sectional view showing the state in which solder is applied to the mainland and other portions of the module substrate when viewed in the direction indicated by the arrow XVI—XVI in FIG. 15.
Figure 17:
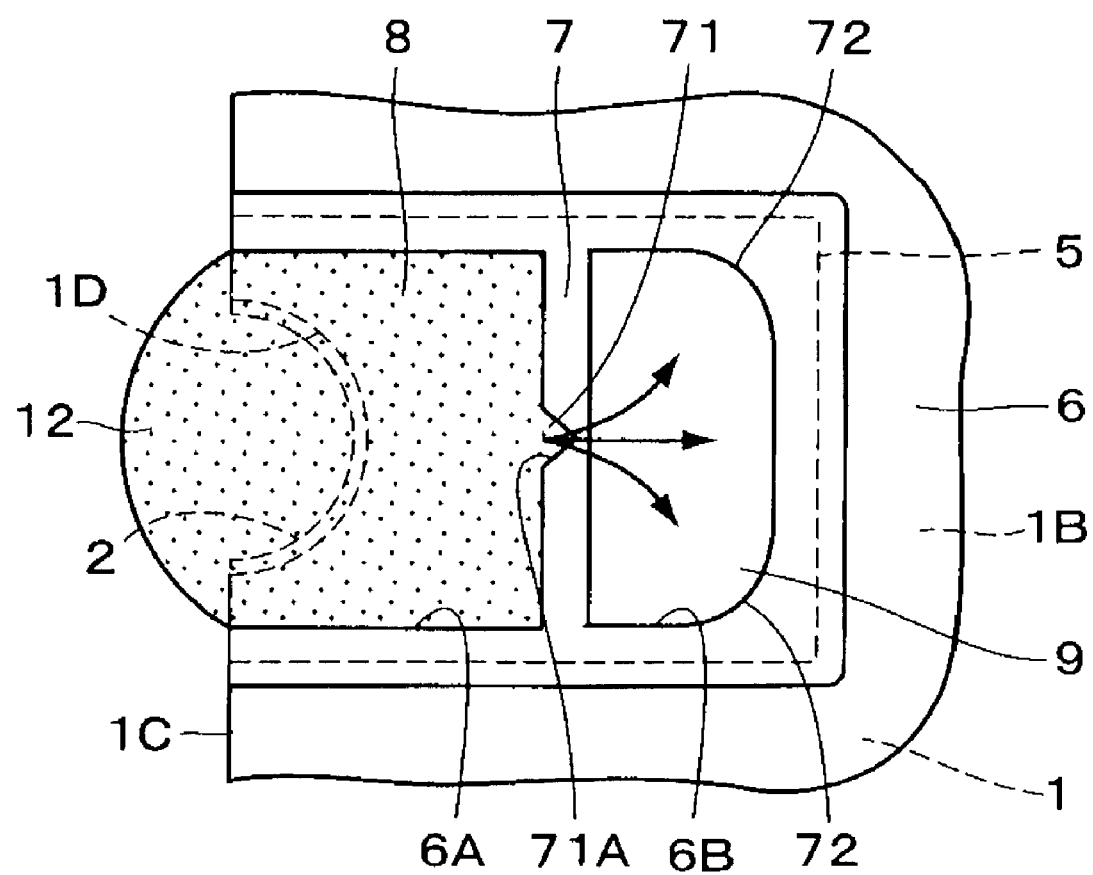
FIG. 17 is a partly enlarged bottom view showing the rear surface of the module substrate shown in FIG. 16.

Next, a seventh preferred embodiment of the present invention is shown in FIGS. 15 to 17, and in this preferred embodiment, a partition having a notch portion is provided, and in addition, curved portions are provided at the corners of the sub-land apart from the corresponding partition. The same reference numerals of the constituent elements in the first preferred embodiment designate the same constituent elements in this preferred embodiment, and descriptions thereof are omitted.

Reference numeral 71 indicates a notch portion provided for the partition 7, and as is the notch portion 61 in the sixth preferred embodiment, the notch portion 71 is formed at the approximately central position (approximately middle position) in the length direction of the partition 7 and is a cut 71A having an approximately triangular shape which tapers from the mainland 8 toward the sub-land 9. In addition, the notch portion 71 is formed at a position corresponding to an exposed triangular portion of the metal film 5, which is exposed at the position of the cut 71A, so as to directly face the mainland 8.

Reference numeral 72 indicates curved portions of the sub-land 9 which are spaced apart from the corresponding partition 7, and the curved portions 72 are provided at two corners of the sub-land 9 having an approximately rectangular shape and are far from the notch portion 71. For example, by forming the opening 6B in the resist film 6 so as to have substantially circular arcs at positions corresponding to the corners of the sub-land 9, the curved portions 71 are formed.

By the structure of this preferred embodiment as described above, advantages approximately equivalent to those described in the first and sixth preferred embodiments can also be obtained. Since the curved portions 72 are provided at the corners of the sub-land 9 apart from the partition 7 in this preferred embodiment, when the substrate 1 is mounted, non-coated areas are not formed around the corners of the sub-land 9, and hence the entire surface thereof can be reliably covered with the solder 12.

Figure 18:
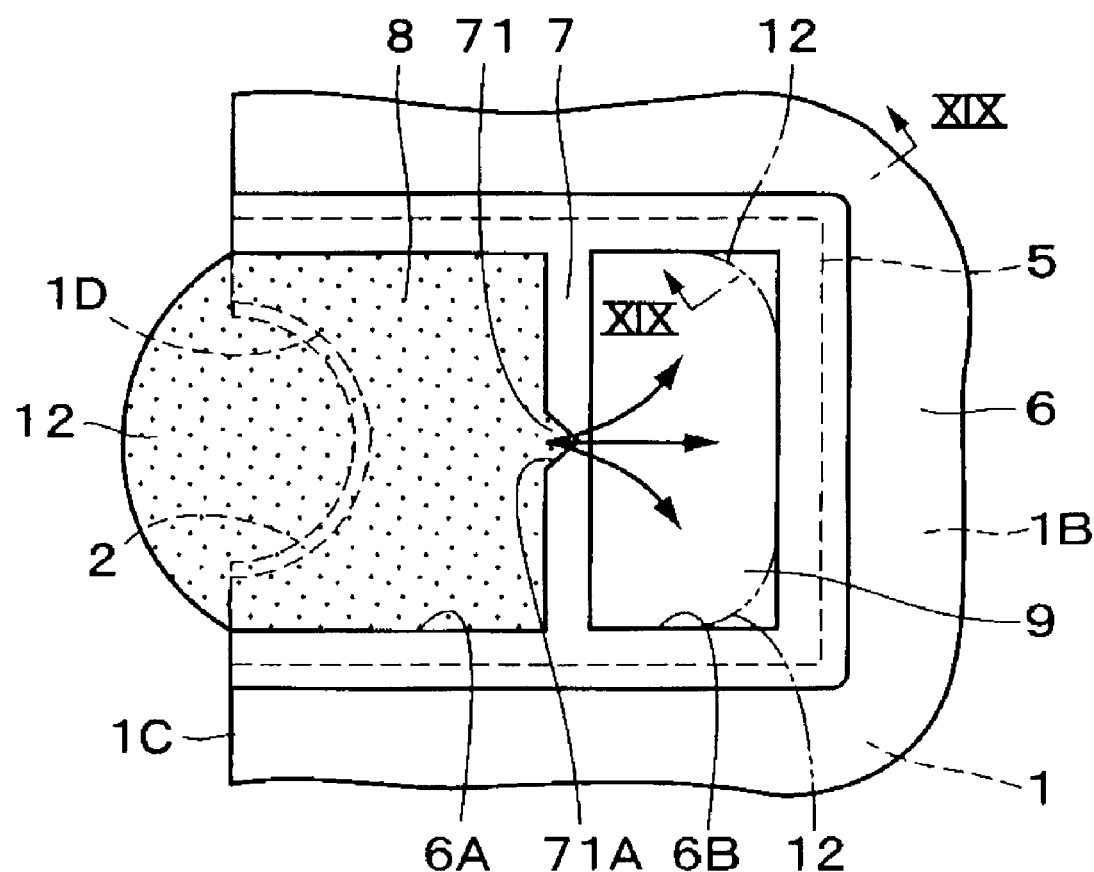
FIG. 18 is a partly enlarged bottom view showing the rear surface of a module substrate according to a comparative example.

That is, as is a comparative example shown in FIG. 18, when the curved portions are not formed, when the substrate 1 is mounted, since spreading from the notch portion 71, the solder 12 might not reach the two corners of the sub-land 9 apart from the partition 7, and as a result, the formation of the non-coated areas is prevented from occurring. If the non-coated areas would be formed to which the solder 12 is not applied, as described above, the corners of the sub-land 9 and a portion of the wire pattern 11 are exposed to the air, and hence a problem might arise in that corrosion, such as oxidation of the sub-land 9 and other problems, might occur.

Figure 19:
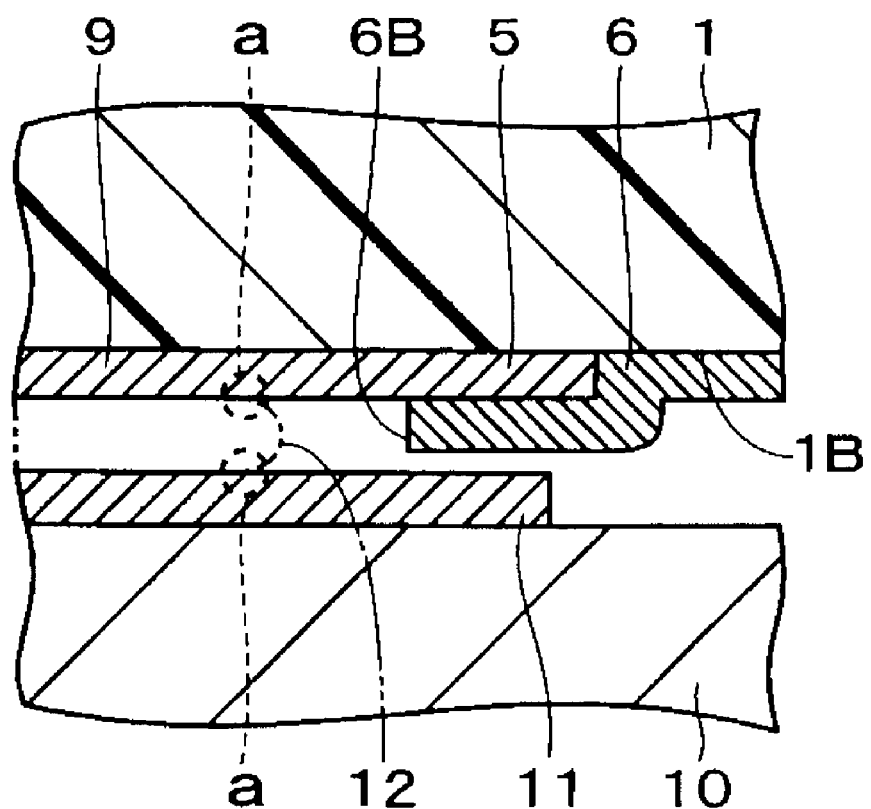
FIG. 19 is a partly enlarged cross-sectional view showing the state in which the module substrate according to the comparative example is mounted on a motherboard when viewed in the direction indicated by the arrow XIX—XIX in FIG. 18.

In addition, when the flow of the solder 12 is stopped while spreading, since the solder 12 may have a cross-section in a substantially circular arc because of its surface tension, grooves each having an acute angle, such as an "a" portion shown in FIG. 19, are likely to be formed between the solder 12 and the sub-land 9 and between the solder 12 and the wire pattern 11. In this case, since stress is liable to concentrate at the "a" portion, a problem may arise in that peeling is liable to occur between the solder 12 and the sub-land 9 or the wire pattern 11.

In contrast, in this preferred embodiment, since the curved portions 72 are formed at the corners of the sub-land 9 apart from the partition 7, the solder 12 can spread over the entire surface of the sub-land 9, and corrosion of the sub-land 9, peeling of the solder 12, or other problems can be prevented, resulting in improvement in reliability and durability.

In this preferred embodiment, the curved portions 72 having a substantially circular arc shape are provided at the corners of the sub-land 9, and in addition, portions each having a linear shape may also be provided at the corners of the sub-land 9.

Figure 20:
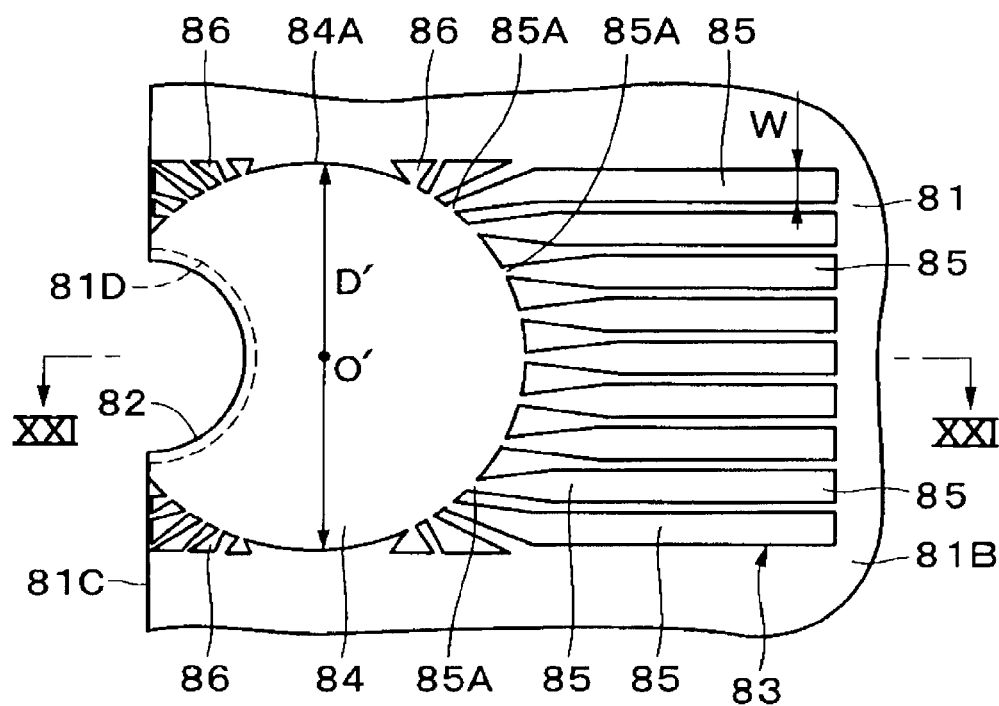
FIG. 20 is a partly enlarged bottom view showing a circuit board device according to an eighth preferred embodiment of the present invention.
Figure 21:
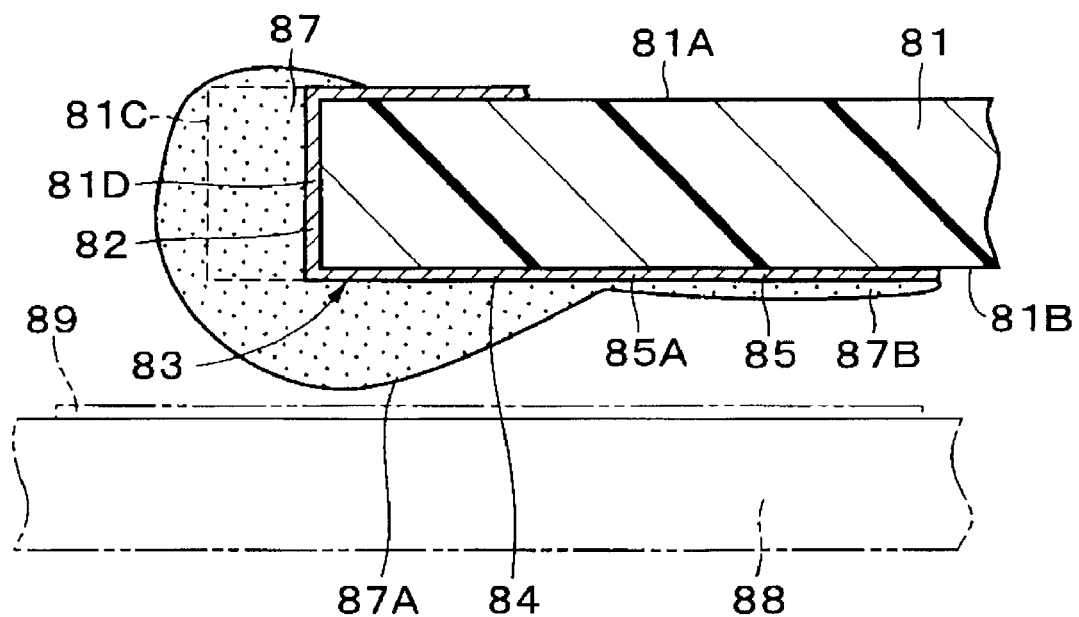
FIG. 21 is a partly enlarged cross-sectional view showing the state in which solder extends from a mainland to a sub-land of a module substrate, when viewed in the direction indicated by the arrow XXI—XXI in FIG. 20.

Next, a eighth preferred embodiment of the present invention is shown in FIGS. 20 and 21. In this preferred embodiment, a mainland having an approximately circular shape is connected to a plurality of strip-shaped sub-lands. The same reference numerals of the constituent elements in the first preferred embodiment designate the same constituent elements in this preferred embodiment, and descriptions thereof are omitted.

Reference numeral 81 indicates a module substrate constituting a main body of a circuit board device. As shown in FIGS. 20 and 21, in a manner approximately equivalent to that in the first preferred embodiment, the module substrate 81 has a front surface 81A, a rear surface 81B, four end surfaces 81C, and a plurality of grooves 81D, and in each groove 81D, an end-surface electrode 82 is provided. In addition, the electronic component 4 is mounted on the module substrate 81 at the front surface 81A side, and the rear surface 81B side is mounted on a motherboard 88 described later.

Reference numeral 83 indicates a metal film provided at the rear surface 81B side of the module substrate 81, and the metal film 83 is processed, for example, by etching to form a mainland 84 and sub-lands 85 and 86.

Reference numeral 84 indicates a mainland which is a portion of the metal film 83 and which is provided at the rear surface 81B side of the module substrate 81. In a manner approximately equivalent to that in the fourth preferred embodiment, the mainland 84 is arranged so as to surround the end-surface electrode 82 of the substrate 81 and is connected thereto.

In addition, the mainland 84 has, for example, an approximately circular shape having an area larger than that of a semicircle; a substantially circular arc portion 84A of the mainland 84, which forms the periphery thereof, has a central angle larger than about 180°; and the center O' of this substantially circular arc portion 84A is disposed inside the substrate 81 and apart from the end surface 81C of the substrate 81. Accordingly, as shown in FIG. 21, when a protruding portion 87A of a solder 8 described below is protruded downward from the mainland 84, the protruding dimension of the solder 87 can be made largest when being compared to any lands having various shapes.

Reference numeral 85 indicates a plurality of sub-lands which are each defined by a portion of the metal film 83 other than that for the mainland 84 and which are each provided at the rear surface 81B side of the module substrate 81. As shown in FIG. 20, each sub-land 85 has a strip shape and an area smaller than that of the mainland 84, and width dimension W (dimension in the direction that is substantially parallel to the end surface 81C of the substrate 81) is smaller than the width dimension (diameter D') of the mainland 84.

In this preferred embodiment, each sub-land 85 extends approximately linearly in the direction opposite to the end-surface electrode 82 (mainland 84) of the substrate 81, and one end of the sub-land 85 in the longitudinal direction is separately connected to the mainland 84 through a narrow portion 85A having a width smaller than width dimension W of the sub-land 85. In addition, on the whole, the sub-lands 85 are disposed substantially parallel to each other to form a stripe pattern, and the intervals between the sub-lands 85 are each smaller than width dimension W of the sub-land 85. In addition, other sub-lands 86 are connected to the periphery of the mainland 84 at positions which are different from those to which the sub-lands 85 are connected.

In addition, by forming an expansion portion 87B of the solder 87 as described below, these sub-lands 85 and 86 secure a sufficiently large connection area between the module substrate 81 and the motherboard 88.

The module substrate 81 according to this preferred embodiment has the structure as described above, and next, a solder-application step, a substrate mounting step, and other steps performed for the module substrate 81 will be described which are performed in a manner approximately equivalent to that described in the first preferred embodiment.

First, when being applied to the module substrate 81, the solder 87 melted at the end-surface electrode 82 side is adhered to the mainland 84 in an approximately circular shape as shown in FIG. 21, and as approximately equivalent to the fourth preferred embodiment, the protruding portion 87A of the solder 87 largely protrudes from the mainland 84 even when the amount thereof is relatively small.

In addition, a portion of the solder 87 adhered to the mainland 84 flows into the sub-land 85 side through the corresponding narrow portion 85A. In this case, a small amount of the solder 87 corresponding to a small area (width dimension W) of the sub-land 85 flows thereinto, and subsequently, the part of the solder 87 slowly flows along the strip-shaped sub-land 85. In addition, a portion of the solder 87 also flows into the other sub-land 86 side as described above.

Accordingly, the solder 87 flowing into each of the sub-lands 85 and 86 protrudes downward from the module substrate 81, and the protruding dimension thereof is smaller than that of the protruding portion 87A, thereby forming the thin expansion portions 87B in a stripe pattern extending along the sub-lands 85 and 86. Subsequently, the protruding portion 87A and the expansion portion 87B, which are in the state described above, can be solidified.

Accordingly, in the substrate mounting step, when the solder 87 is heated while the module substrate 81 is placed on the motherboard 88, the protruding portion 87A of the solder 87 is melted and distorted between the substrate 81 and the motherboard 88 in a manner approximately equivalent to that of the first preferred embodiment. Accordingly, even when the warping or other defect occurs between the substrate 81 and the motherboard 88, the mainland 84 of the substrate 81 and a corresponding wire pattern 89 at the motherboard 88 side can be reliably connected to each other with the solder 87.

In addition, in the step described above, the expansion portions 87B of the solder 87 are melted on the sub-lands 85 and 86 and then spread across the lands 85 and across the lands 86, and as a result, the sub-lands 85 and 86 are placed in the state of solder wetting (close to the state in which treatment using a solder leveler is performed). Hence, a portion of the solder 87 which is distorted at the mainland 84 side and pushed out therefrom can be smoothly spread along these sub-lands 85 and 86 in the state of solder wetting.

By the structure of this preferred embodiment as described above, advantages approximately equivalent to those described in the first and the fourth preferred embodiments can be obtained. That is, since the mainland 84 has an approximately circular shape, for example, by simply adhering a necessary minimum amount of the solder 87 to the mainland 84, the protruding dimension of the protruding portion 87A, which protrudes downward from the substrate 81, can be made sufficiently large, and in addition, the protruding dimension can be optionally adjusted in accordance with diameter D' of the mainland 84.

In particular in this preferred embodiment, since the structure in which the plurality of strip-shaped sub-lands 85 is disposed in a stripe pattern and is connected to the mainland 84, when the solder 87 is applied to the substrate 81, a portion of the solder 87 is allowed to flow to the sub-land 85 side, and hence the expansion portions 87 in a stripe pattern extending in a predetermined area can be formed. In this case, by adjusting width dimension W of the sub-land 85 and the shape of the narrow portion 85A beforehand, the amount of the solder 87 flowing from the mainland 84 to the sub-land 85 side and the thickness or the characteristics of the expansion portion 87A can be appropriately determined, and hence, while the amount of the solder 87 (protruding dimension of the protruding portion 87A) remains at the mainland 84 side can be sufficiently secured, the sub-lands 85 and 86 can be placed beforehand in the state of solder wetting.

Accordingly, when the module substrate 81 is mounted on the motherboard 88, a portion of the solder 87 adhered to the mainland 84 side can be spread reliably along the sub-lands 85 and 86, and hence the module substrate 81 can be securely soldered to the motherboard 88 by the mainland 84 and the sub-lands 85 and 86, which have a large area. As a result, non-uniform soldering or other defect between the substrate 81 and the motherboard 88 can be reliably prevented, and thereby the bonding strength therebetween can be further increased.

Figure 22:
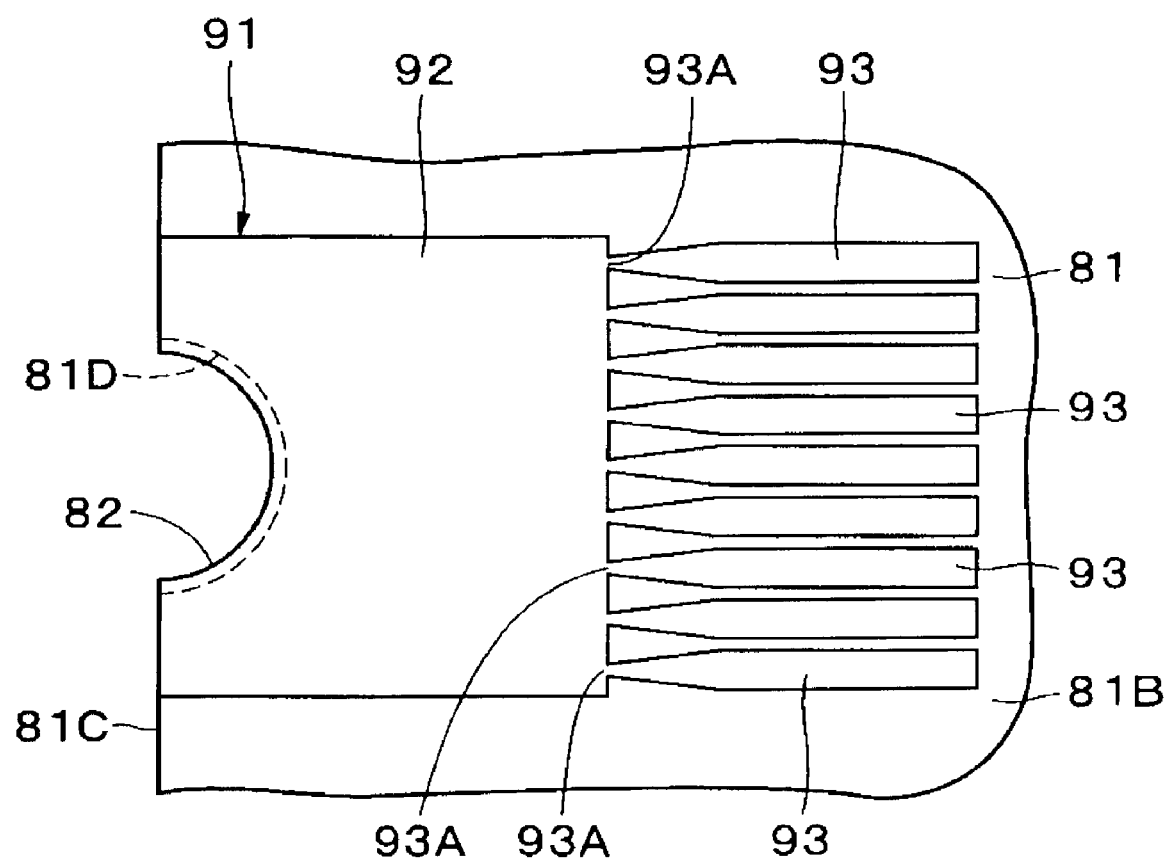
FIG. 22 is a partly enlarged bottom view showing a circuit board device according to a ninth preferred embodiment of the present invention.

Next, a ninth preferred embodiment of the present invention is shown in FIG. 22, and in this preferred embodiment, the eighth embodiment is applied to a substantially rectangular mainland. The same reference numerals of the constituent elements in the eighth preferred embodiment designate the same constituent elements in this preferred embodiment, and descriptions thereof are omitted.

Reference numeral 91 indicates a metal film provided at the rear surface 81B side of the module substrate 81, and the metal film 91 defines a mainland 92 and a sub-land 93, which will he described below.

Reference numeral 92 indicates an approximately rectangular mainland defined by a portion of the metal film 91, and the mainland 92 is disposed so as to surround the end-surface electrode 82 of the module substrate 81 and is connected thereto.

Reference numeral 93 indicates a plurality of sub-lands each formed of the other portion of the metal film 91, and as is the sub-land 85 of the eighth preferred embodiment, the sub-lands 93 each have a strip shape and a smaller area than that of the mainland 92. In addition, the sub-lands 93 extend in the direction opposite to the mainland 92 and the end-surface electrode 82 so as to form a stripe pattern and are each separately connected to the mainland 92 through a narrow portion 93A provided at one end of the sub-land 93 in the longitudinal direction.

By the structure of this preferred embodiment described above, advantages approximately equivalent to those in the eighth preferred embodiment can also be obtained.

Figure 23:
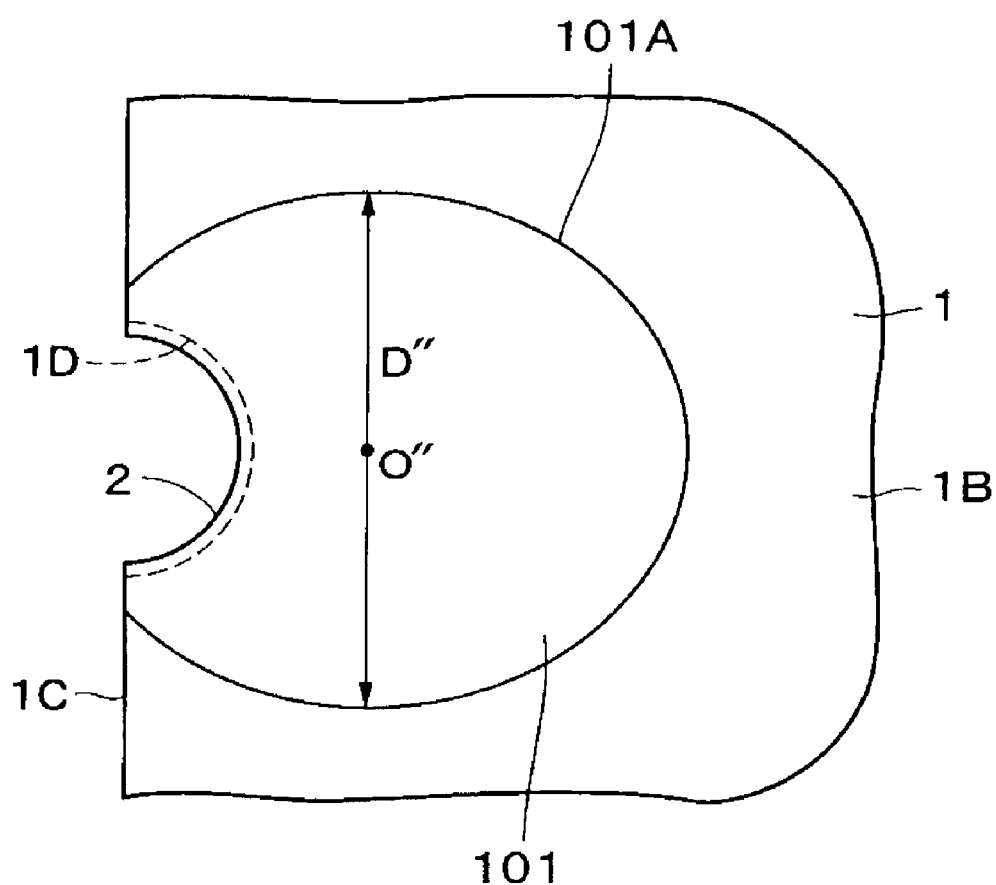
FIG. 23 is a partly enlarged bottom view showing a circuit board device according to a tenth preferred embodiment of the present invention.

Next, a tenth preferred embodiment of the present invention is shown in FIG. 23, and in this preferred embodiment, a land having an approximately circular shape is provided on a module substrate. The same reference numerals of the constituent elements in the first preferred embodiment designate the same constituent elements in this preferred embodiment, and descriptions thereof are omitted.

Reference numeral 101 indicates a land which is composed of a metal film or other suitable element and is provided at the rear surface 1B of the module substrate 1, and as is the fourth preferred embodiment, the land 101 has an approximately circular shape having an area larger than that of a semicircular shape. In addition, the land 101 has a substantially circular arc portion 101A, which forms the periphery thereof, having a central angle larger than about 180°, and a center O″ of the circular arc portion 101A is disposed inside the substrate 1 and apart from the end surface 1C. The width dimension of the land 101 has the maximum value equivalent to diameter D″ at a position apart from the end surface 1C. In addition, the land 101 has an area approximately equivalent to the total area of the mainland 44 and the sub-land 45 in the fourth preferred embodiment.

When a necessary minimum amount of the solder 12 is adhered to the land 101, the protruding dimension thereof can be made as large as possible in accordance with diameter D″, and while the amount of the solder 12 adhered to the land 101 is appropriately controlled, the warping and other defects of the module substrate 1 and the motherboard 10 can be reliably ignored.

By the structure of this preferred embodiment described above, advantages approximately equivalent to those in the first and the fourth preferred embodiments can also be obtained.

Figure 24:
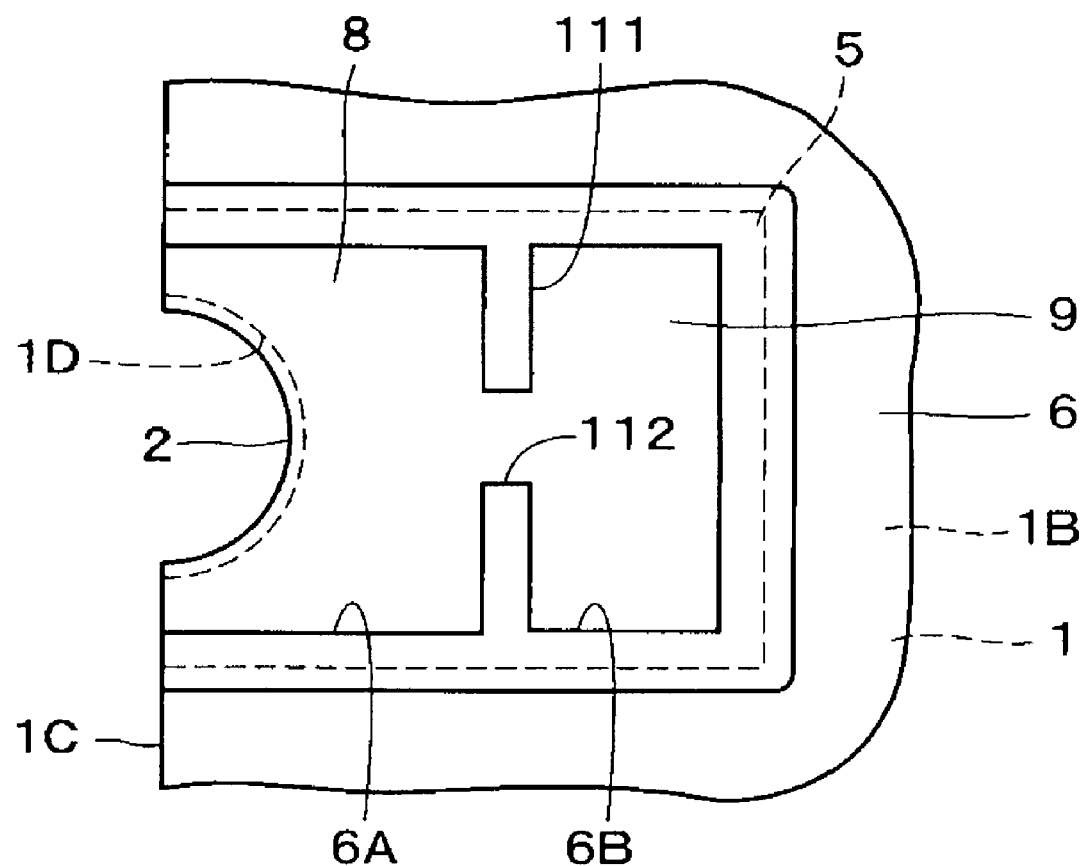
FIG. 24 is a partly enlarged bottom view showing a circuit board device according to a first modified preferred embodiment of the present invention when viewed from the same position as that shown in FIG. 6.
Figure 25:
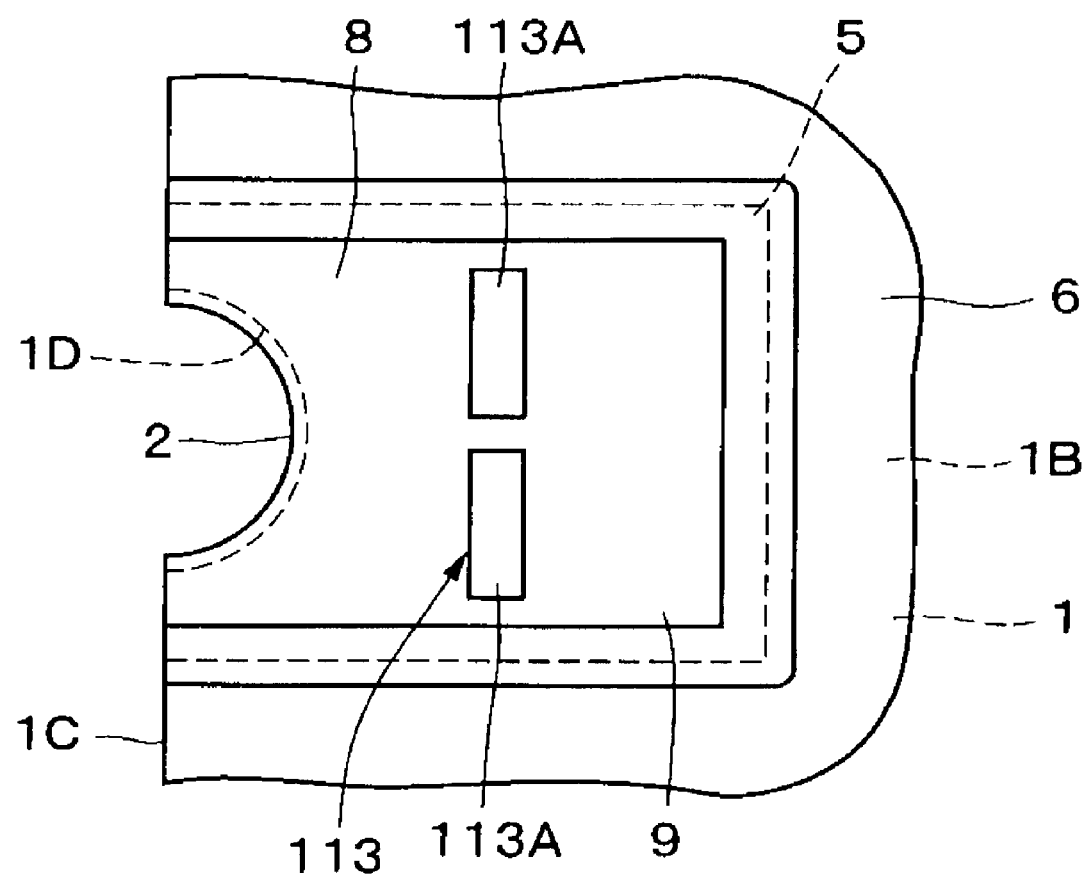
FIG. 25 is a partly enlarged bottom view showing a circuit board device according to a second modified preferred embodiment of the present invention when viewed from the same position as that shown in FIG. 6.

In the first and the second preferred embodiments, the partitions 7 and 21 are each formed as a strip-shaped wall across the metal film 5. However, the present invention is not limited thereto, and for example, according to a first modified preferred embodiment as shown in FIG. 24, a cut portion 112 may be provided in the approximately central portion of a partition 111 along the longitudinal direction. In addition, for example, as is a second modified preferred embodiment shown in FIG. 25, a partition 113 may be formed of a plurality of island-shaped members 113A which are disposed at predetermined intervals therebetween.

Figure 26:
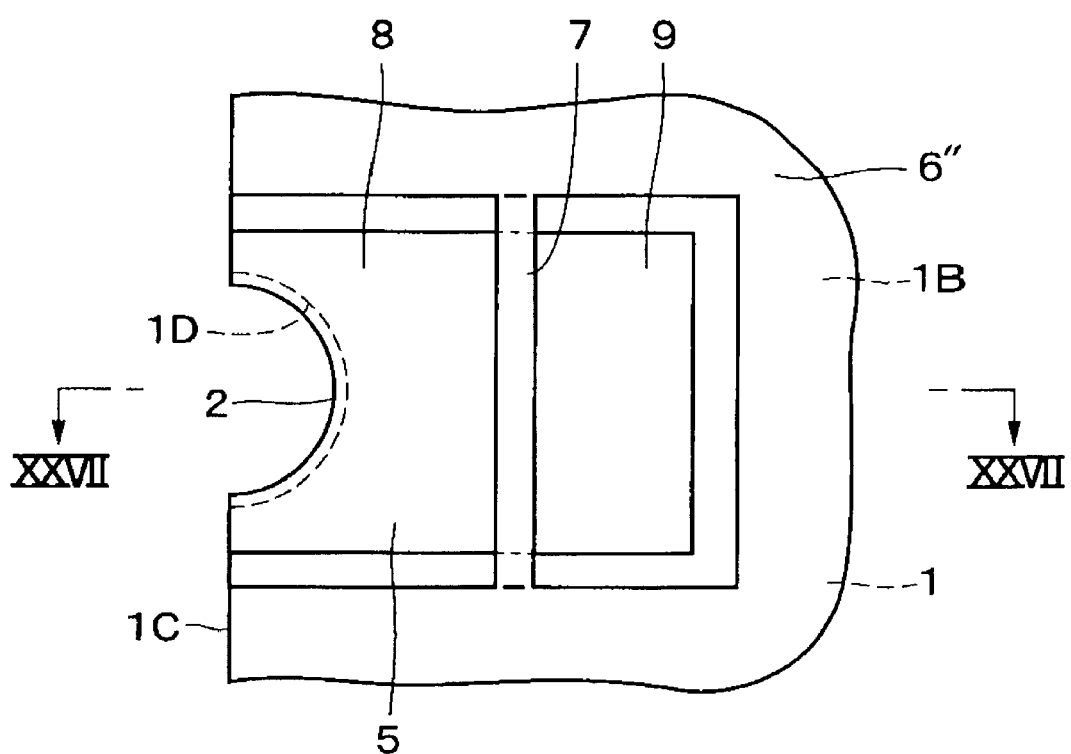
FIG. 26 is a partly enlarged bottom view showing a circuit board device according to a third modified preferred embodiment of the present invention when viewed from the same position as that shown in FIG. 6.
Figure 27:
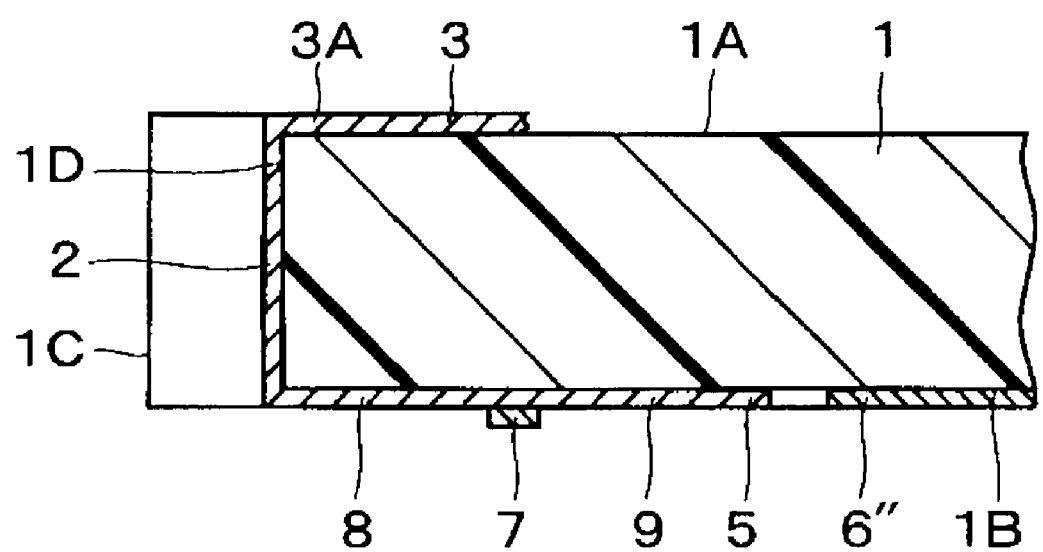
FIG. 27 is a partly enlarged cross-sectional view showing the circuit board device according to third modified preferred embodiment when viewed in the direction indicated by the arrow XXVII—XXVII in FIG. 26.

In addition, in the first and the second preferred embodiments, the resist film 6 is arranged so as to cover the periphery of the metal film 5. However, the present invention is not limited thereto, and for example, as in the third modified preferred embodiment shown in FIGS. 26 and 27, a resist film 6" may be disposed at a distance from the metal film 5.

In the third preferred embodiment, the partition 33 is a gap formed between the lands 31 and 32. However, the present invention is not limited thereto, and for example, various materials having poor solder wettability, such as a resist material or a silk-screen material, may be filled between the lands 31 and 32.

In the eighth to tenth preferred embodiments, for example, by etching the metal films 83 and 91, lands 84, 85, 86, 92, 93, 101, and so on are formed. However, the present invention is not limited thereto, and lands having the same shapes as those of the eighth to tenth preferred embodiments may be formed in a manner approximately equivalent, for example, to that of the first preferred embodiment. In addition, in this case, for example, by forming a resist film or other element on the metal film formed on the rear surface of the module substrate followed by etching of the resist film, openings are formed in the resist film, and as a result, lands 84, 85, 86, 92, 93, 101, and so on are each formed of the metal film exposed in each opening. Accordingly, since the lands each recessed from the surface of the resist film can be formed, solder flowing into the lands is prevented from overflowing outside, and hence the solder can be securely disposed on the lands.

In the fourth, fifth, eighth, and tenth preferred embodiments, the lands 44, 51, 84, 101, and so on each have an approximately circular shape. However, the present invention is not limited thereto, and lands having an approximately oval shape may also be used.

In the fourth, fifth, and eighth preferred embodiments, in addition to primary sub-lands 45, 52, and 85, the other sub-lands 46, 53, and 86 are provided at the end surfaces 1C, 81C, or the like of the substrates 1 and 81. However, the present invention is not limited thereto, and the other sub-lands 46, 53, and 86 may be omitted.

In addition, in the sixth and seventh preferred embodiments, the notch portions 61 and 71 are each formed in the partition 7 composed of a resist material. However, the notch portions may be formed in the partitions 21 and 33 of the second and the third preferred embodiments, respectively.

Figure 28:
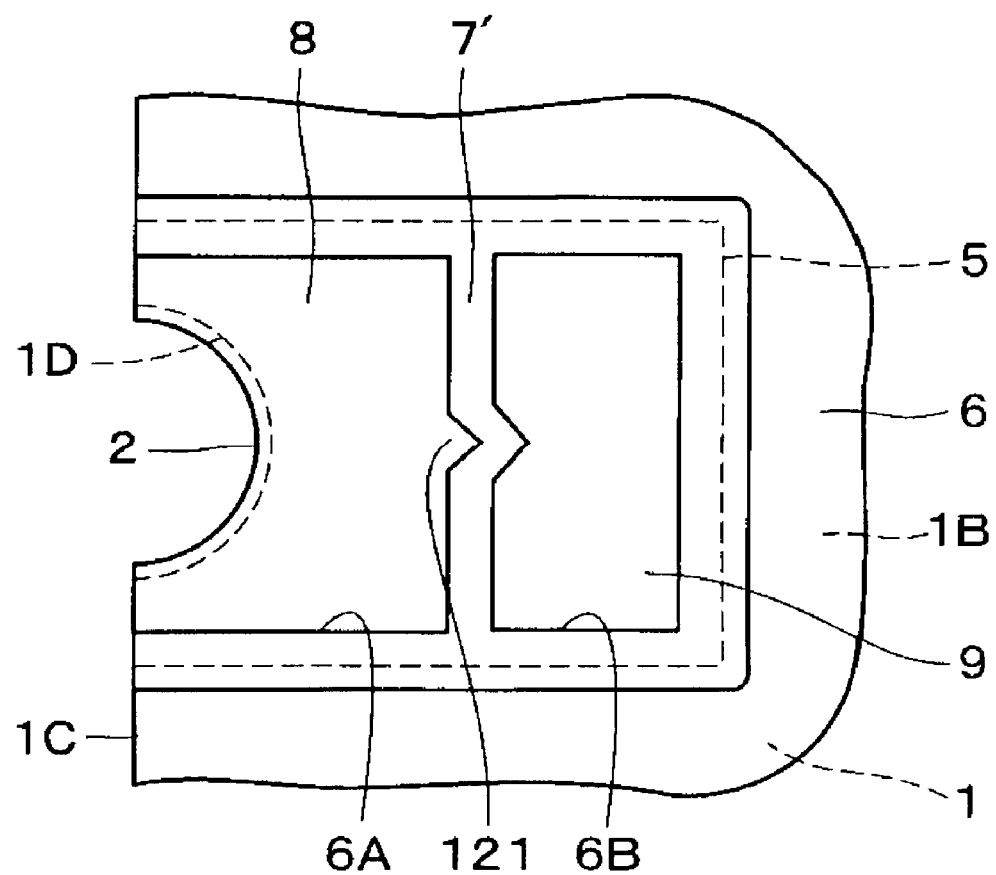
FIG. 28 is a partly enlarged bottom view showing a circuit board device according to a fourth modified preferred embodiment of the present invention when viewed from the same position as that shown in FIG. 6.

In the sixth and seventh preferred embodiments, the notch portions 61 and 71 are the cuts 61A and 71A, respectively, formed in the partitions 7. However, the present invention is not limited thereto, and for example, as is a fourth modified preferred embodiment shown in FIG. 28, a notch portion 121 may be formed by bending a portion of a partition 7'.

Figure 29:
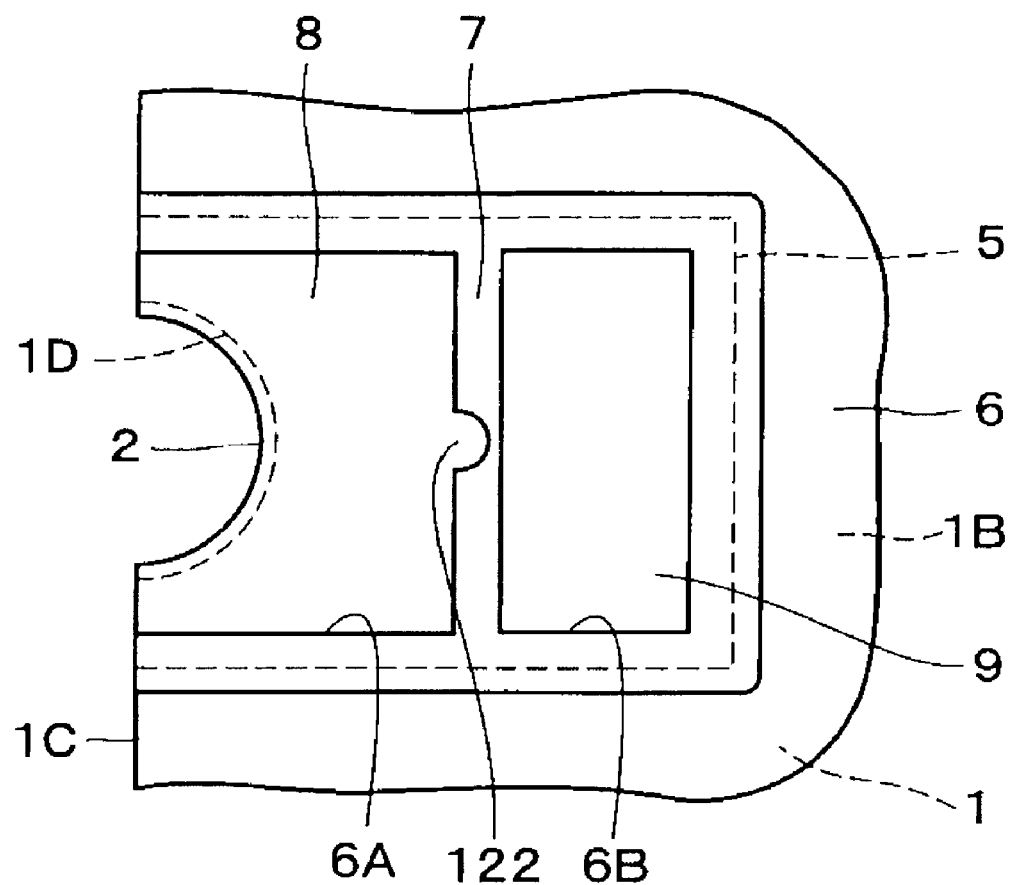
FIG. 29 is a partly enlarged bottom view showing a circuit board device according to a fifth modified preferred embodiment of the present invention when viewed from the same position as that shown in FIG. 6.

In addition, in the sixth and seventh preferred embodiments, the notch portions 61 and 71 in an approximately triangular shape are formed. However, for example, as is a fifth modified preferred embodiment shown in FIG. 29, a notch portion 122 in an approximately semicircular shape may be formed.

Figure 30:
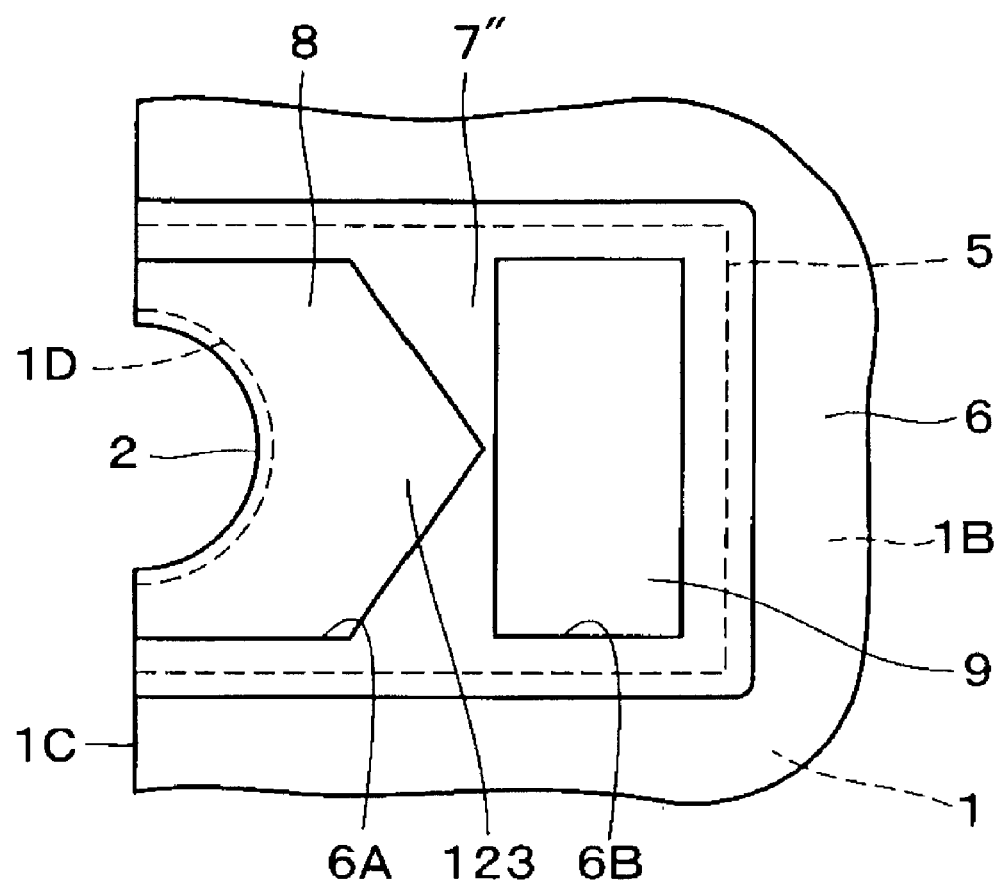
FIG. 30 is a partly enlarged bottom view showing a circuit board device according to a sixth modified preferred embodiment of the present invention when viewed from the same position as that shown in FIG. 6.

In the sixth and seventh preferred embodiments, the notch portions 61 and 71 are each formed in a portion of the partition 7 that extends linearly. However, for example, as is a sixth modified preferred embodiment shown in FIG. 30, a notch portion 123 may be formed along the entire length of a partition 7".

Figure 31:
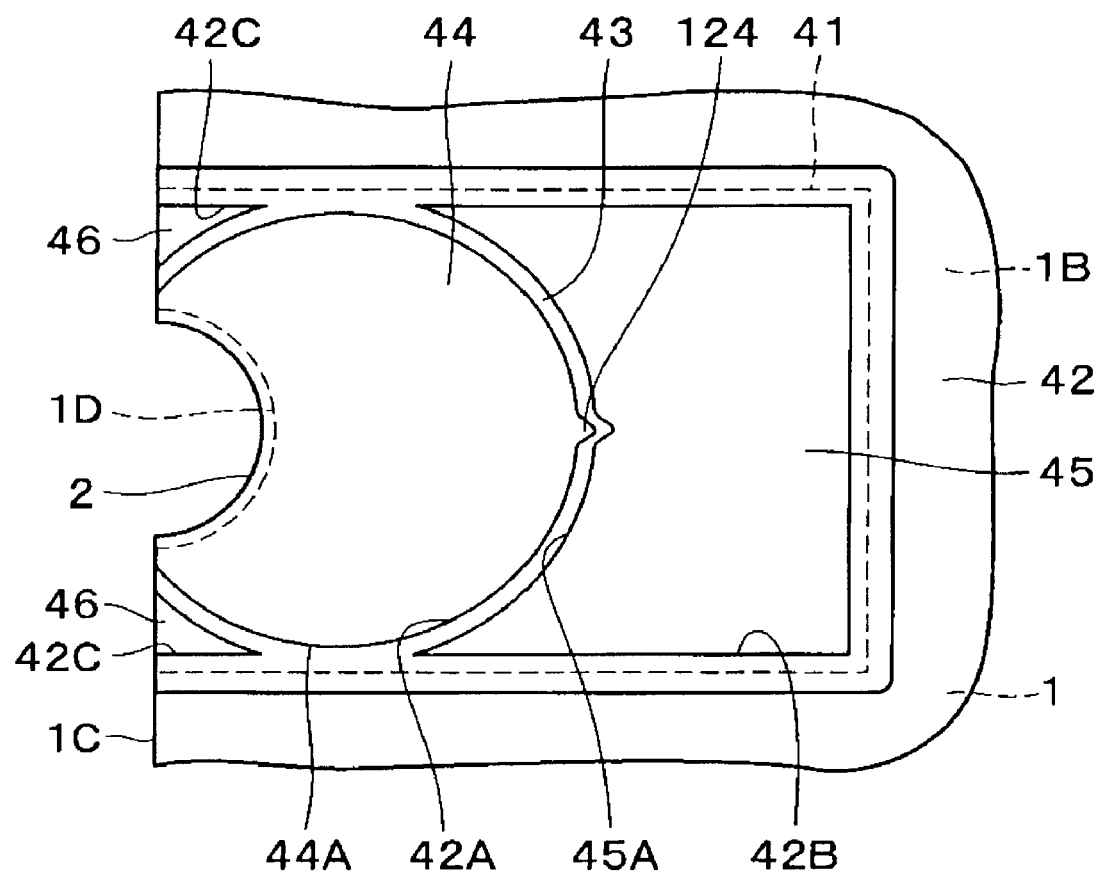
FIG. 31 is a partly enlarged bottom view showing a circuit board device according to a seventh modified preferred embodiment of the present invention when viewed from the same position as that shown in FIG. 6.

In addition, in the sixth and seventh preferred embodiments, the notch portions 61 and 71 are each formed in the partition 7 provided between the mainland 8 and the sub-land 9 according to the first preferred embodiment. However, the present invention is not limited thereto, and for example, as is a seventh modified preferred embodiment shown in FIG. 31, a notch portion 124 may be formed in the partition 43 provided between the mainland 44 and the sub-land 45.

In the sixth and seventh preferred embodiments, the notch portions 61 and 71 are each formed at the central position in the length direction of the partition 7. However, each of the notch portions 61 and 71 may be formed at a position shifted from the central position in the length direction of the partition 7.

Figure 32:
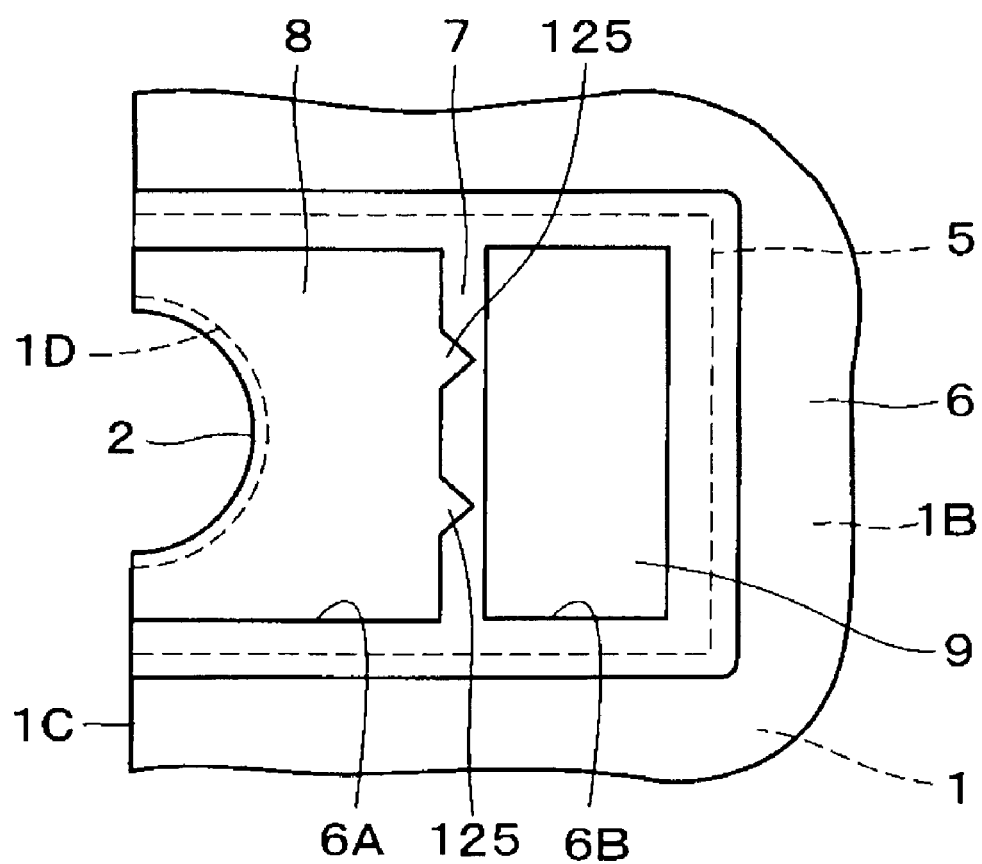
FIG. 32 is a partly enlarged bottom view showing a circuit board device according to an eighth modified preferred embodiment of the present invention when viewed from the same position as that shown in FIG. 6.

In addition, in the sixth and seventh preferred embodiments, the single notch portions 61 and 71 are each formed in the partition 7. However, for example, as is an eighth modified preferred embodiment shown in FIG. 32, two notch portions 125 may be formed in the partition 7, or at least three notch portions may also be formed therein.

In the preferred embodiments described above, the module substrate 1 is described by way of example. However, the present invention is not limited thereto and may be naturally applied to various substrates which are mounted on the motherboard 10.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A method for mounting a circuit board device on a motherboard, the circuit board device including a substrate having a front surface on which an electronic component is mounted, a rear surface to be mounted on the motherboard, and end surfaces, end-surface electrodes which are provided on the end surfaces and to which the electronic component is connected, lands which are provided on the rear surface and are connected to the end-surface electrodes and which are to be soldered to the motherboard together with the end-surface electrodes, the lands each including a mainland connected to each of the end-surface electrodes and a sub-land disposed at a distance therefrom, and partitions each provided on the rear surface side for separating the mainland from the sub-land, the method comprising the steps of:

preparing solder;

forming protruding portions which are composed of the solder covering the mainlands and which protrude from the rear surfaces by melting the solder in order to flow on the end-surface electrodes toward the mainlands;

placing the circuit board device on the motherboard in the state in which the protruding portions face respective wire patterns of the motherboard;

melting the solder so as to adhere to the wire patterns; and allowing the solder present at the mainland sides to flow over the partitions and into the respective sub-land sides, whereby the mainlands and the respective sub-lands are connected to the respective wire patterns of the motherboard.

* * * * *